(12) United States Patent
Tanaka et al.

(10) Patent No.: US 8,309,443 B2
(45) Date of Patent: *Nov. 13, 2012

(54) METHOD FOR MANUFACTURING SEMICONDUCTOR DEVICE AND LASER IRRADIATION APPARATUS

(75) Inventors: Koichiro Tanaka, Isehara (JP); Hirotada Oishi, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 435 days.

This patent is subject to a terminal disclaimer.

(21) Appl. No.: 12/611,990

(22) Filed: Nov. 4, 2009

(65) Prior Publication Data

US 2010/0048036 A1 Feb. 25, 2010

Related U.S. Application Data

(63) Continuation of application No. 11/412,075, filed on Apr. 27, 2006, now Pat. No. 7,618,882.

(30) Foreign Application Priority Data

Apr. 28, 2005 (JP) ................................. 2005-133731

(51) Int. Cl.
 *H01L 21/268* (2006.01)

(52) U.S. Cl. ............... 438/487; 219/121.66; 219/121.77
(58) Field of Classification Search .................. 438/166, 438/487, 795; 219/121.65, 121.66, 121.77; 359/223.1, 618
See application file for complete search history.

(56) References Cited

U.S. PATENT DOCUMENTS

| | | | | |
|---|---|---|---|---|
| 5,970,368 A | * | 10/1999 | Sasaki et al. | 438/487 |
| 6,169,014 B1 | * | 1/2001 | McCulloch | 438/487 |
| 6,372,039 B1 | * | 4/2002 | Okumura et al. | 438/487 |
| 6,407,431 B2 | | 6/2002 | Yamazaki et al. | |
| 6,664,498 B2 | | 12/2003 | Forsman et al. | |
| 6,800,541 B2 | * | 10/2004 | Okumura | 438/487 |
| 6,955,956 B2 | | 10/2005 | Tanaka et al. | |
| 7,072,566 B2 | | 7/2006 | Seo et al. | |
| 7,115,514 B2 | | 10/2006 | Stoltz | |
| 7,372,630 B2 | | 5/2008 | Tanaka | |
| 7,381,632 B2 | | 6/2008 | Inui et al. | |

(Continued)

FOREIGN PATENT DOCUMENTS

JP 02-030393 1/1990

(Continued)

OTHER PUBLICATIONS

Search Report (Application No. 06008671.7) dated Aug. 22, 2006.

(Continued)

*Primary Examiner* — Geoffrey S Evans
(74) *Attorney, Agent, or Firm* — Eric J. Robinson; Robinson Intellectual Property Law Office, P.C.

(57) ABSTRACT

It is an object to achieve continuous crystal growth without optical interference using a compact laser irradiation apparatus. A megahertz laser beam is split and combined to crystallize a semiconductor film. At this point of time, an optical path difference is provided between the split beams to reduce optical interference. The optical path difference is set to have a length equivalent to the pulse width of the megahertz laser beam or more and less than a length equivalent to the pulse repetition interval; thus, optical interference can be suppressed with a very short optical path difference. Therefore, laser beams can be applied continuously and efficiently without energy deterioration.

6 Claims, 18 Drawing Sheets

U.S. PATENT DOCUMENTS

| | | |
|---|---|---|
| 7,396,712 B2 | 7/2008 | Tanabe et al. |
| 7,397,592 B2 | 7/2008 | Tanaka |
| 7,476,629 B2 | 1/2009 | Tanaka |
| 7,551,655 B2 | 6/2009 | Tanaka et al. |
| 7,608,527 B2 | 10/2009 | Tanaka et al. |
| 7,618,882 B2 * | 11/2009 | Tanaka et al. ............. 438/487 |
| 7,759,181 B2 | 7/2010 | Tanaka et al. |
| 2001/0019859 A1 * | 9/2001 | Yamazaki et al. ............ 438/149 |
| 2002/0132402 A1 * | 9/2002 | Tanaka et al. ............... 438/166 |
| 2003/0032222 A1 * | 2/2003 | Okumura ..................... 438/166 |
| 2003/0035219 A1 * | 2/2003 | Tanaka ........................ 359/618 |
| 2003/0183603 A1 * | 10/2003 | Forsman et al. ......... 219/121.73 |
| 2003/0222324 A1 * | 12/2003 | Sun et al. ..................... 257/431 |
| 2004/0069751 A1 * | 4/2004 | Yamazaki et al. ............ 438/166 |
| 2004/0097103 A1 | 5/2004 | Imai et al. |
| 2004/0266079 A1 * | 12/2004 | Shimomura et al. ......... 438/166 |
| 2005/0018996 A1 * | 1/2005 | Seo et al. ..................... 385/147 |
| 2005/0036190 A1 * | 2/2005 | Tanaka ........................ 359/223 |
| 2005/0074974 A1 * | 4/2005 | Stoltz .......................... 438/690 |
| 2005/0115930 A1 * | 6/2005 | Tanaka et al. ............. 219/121.6 |
| 2005/0139582 A1 * | 6/2005 | Tanaka ........................ 438/487 |
| 2005/0139786 A1 * | 6/2005 | Tanaka et al. ................ 438/795 |
| 2005/0233512 A1 | 10/2005 | Tanaka et al. |
| 2005/0252894 A1 | 11/2005 | Imai et al. |
| 2006/0019474 A1 * | 1/2006 | Inui et al. ..................... 438/487 |
| 2006/0189034 A1 * | 8/2006 | Tanabe et al. ................ 438/487 |

FOREIGN PATENT DOCUMENTS

| | | | |
|---|---|---|---|
| JP | 2-30393 A | * | 1/1990 |
| JP | 07-016781 | | 1/1995 |
| JP | 7-16781 A | * | 1/1995 |
| JP | 2002-270510 A | | 9/2002 |
| JP | 2003-109912 A | | 4/2003 |
| JP | 2003-287703 | | 10/2003 |
| JP | 2004-343093 A | | 12/2004 |
| WO | 01/18852 | | 3/2001 |
| WO | 03/052890 | | 6/2003 |
| WO | 2004/090195 | | 10/2004 |

OTHER PUBLICATIONS

Choi et al., Ultrafast laser-induced crystallization of amorphous silicon films, Nov. 2003, Opt. Eng. vol. No. 42 (11), pp. 3383-3388.

* cited by examiner before split after split

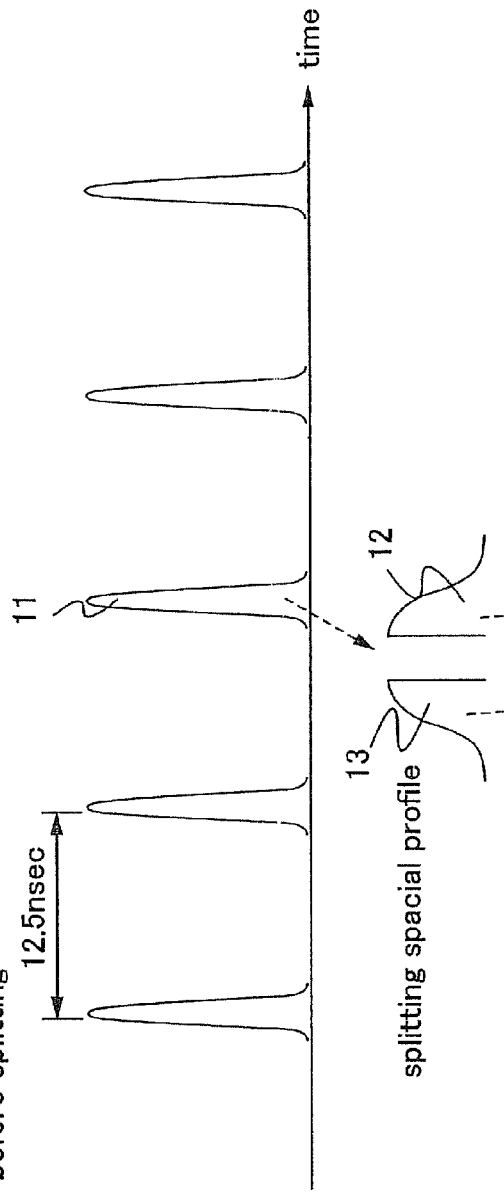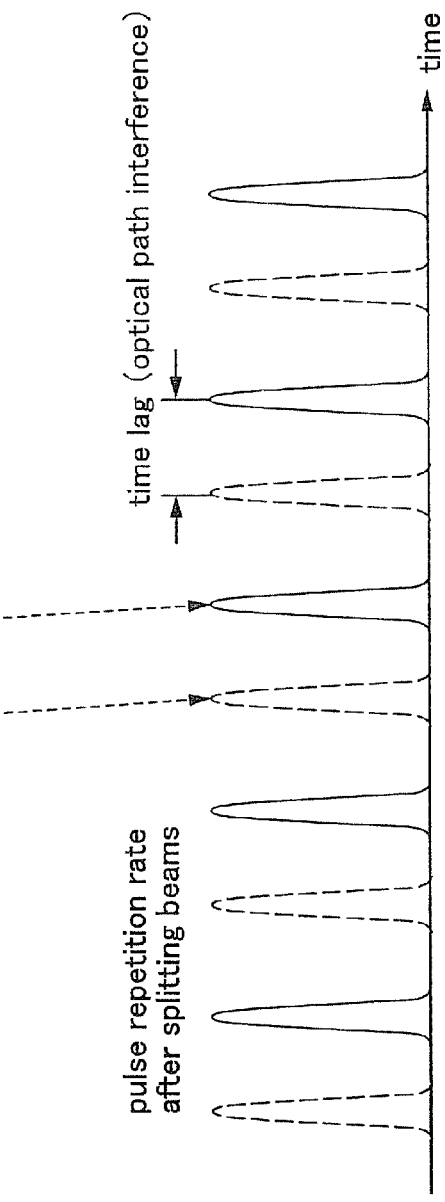

t=0 t=t1 t=t1+t2 t=t1+t2+t3 t=0 t=td t=td+t2 t=td+t2+t3

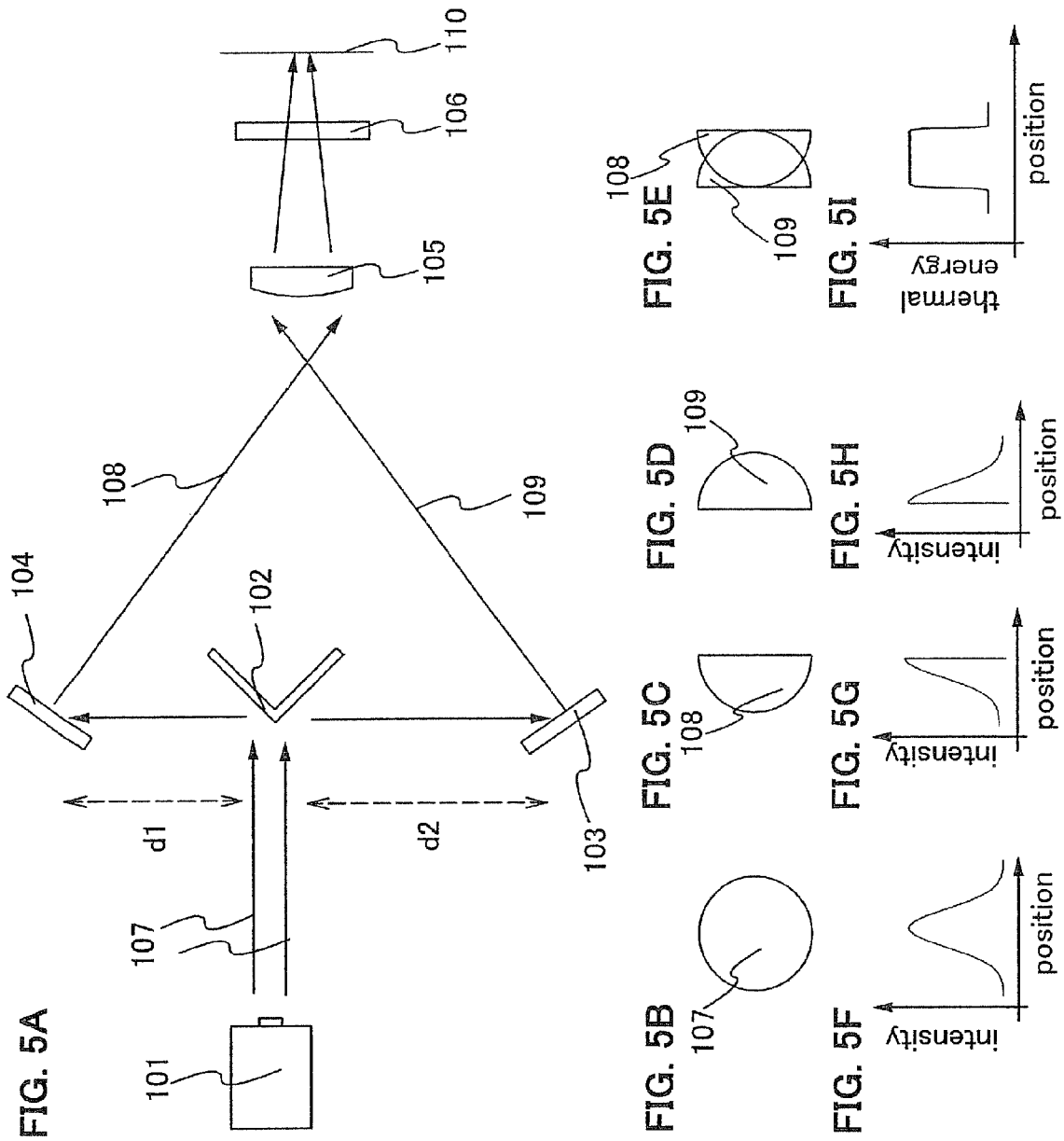

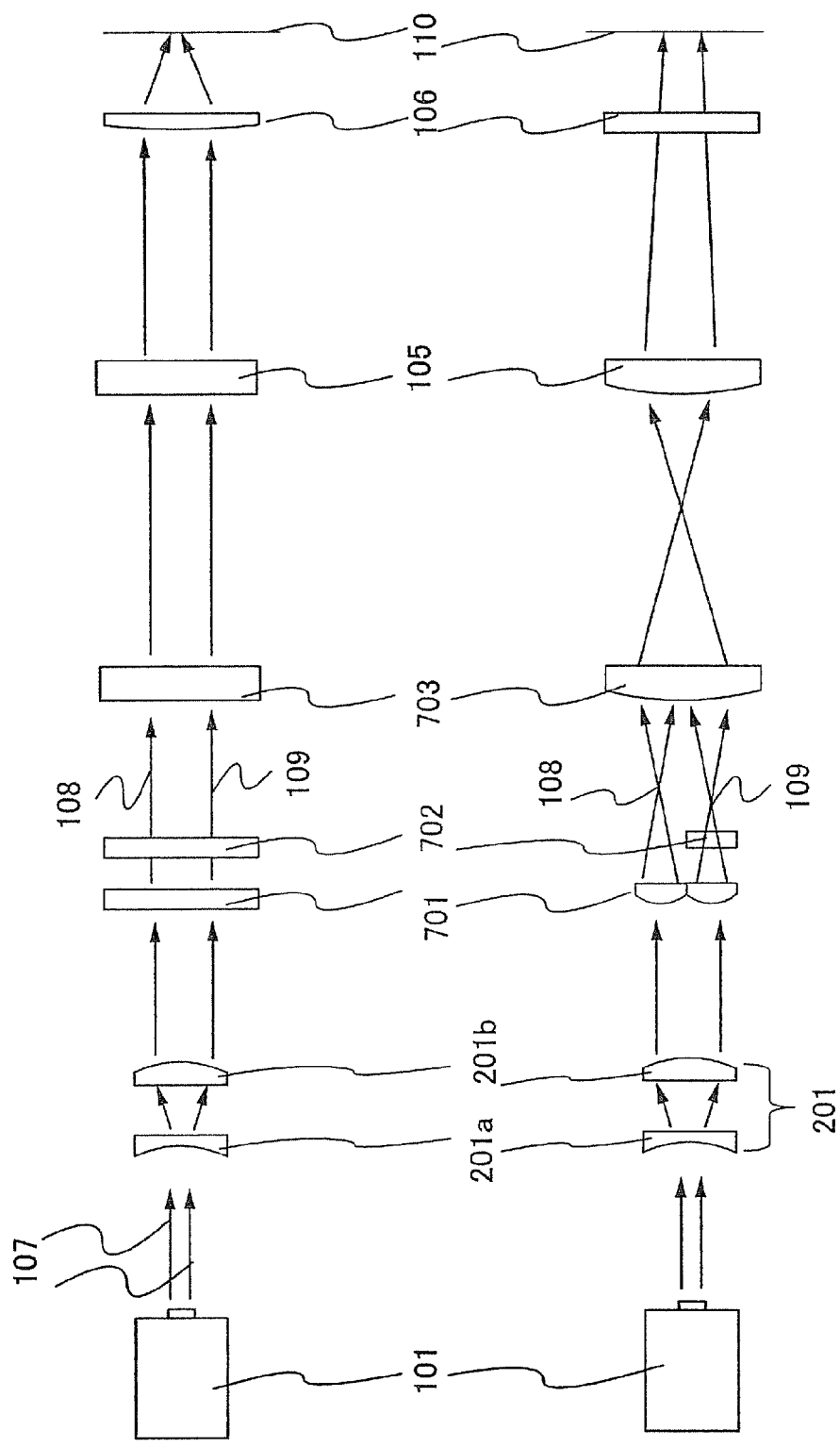

before splitting after splitting

METHOD FOR MANUFACTURING SEMICONDUCTOR DEVICE AND LASER IRRADIATION APPARATUS

BACKGROUND OF THE INVENTION

1. Field of the Invention

The present invention relates to a method for manufacturing a semiconductor device by laser irradiation and to a laser irradiation apparatus.

2. Description of the Related Art

Laser irradiation is generally used in manufacturing a semiconductor device. As one of the reasons, as compared with an annealing method using radiant heating or conductive heating, the treatment time can be reduced substantially. As another reason, the laser irradiation does not thermally damage a substrate which is easily deformed by heat, such as a glass substrate.

However, a beam cross section of a laser beam has energy intensity distribution (hereinafter also referred to as intensity distribution), so that an object to be irradiated could not have been irradiated with a laser beam at a uniform intensity. For example, in the case of crystallizing an object to be irradiated by laser annealing, it has been impossible to obtain a semiconductor film with a uniform crystallinity.

Correspondingly, there is a technology in which a laser beam is split into a plurality of beams, and the split beams are combined, to obtain uniform intensity distribution of a laser beam.

This method makes intensity distribution at beam cross section uniform; however, it also cause interference between the split beams (hereinafter also referred to as split beams). Therefore, although the original intensity distribution at the beam cross section is eliminated, other intensity distribution is newly caused by interference; thus, in this case, a surface to be irradiated cannot be irradiated with a laser beam at uniform intensity.

In response to the problem, an optical path difference equivalent to a temporal coherence length (coherence length) or more is provided between the beams split using a retarding plate to suppress the interference caused by splitting of the beams (Reference 1: Japanese Patent Laid-Open No. 2003-287703).

SUMMARY OF THE INVENTION

Since the optical path difference provided in Reference 1 corresponds to the coherence length or more, a long optical path difference was necessarily provided. For example, in the case of a laser beam emitted from a solid-state laser, the coherence length reaches several meters to several kilometers; thus, it has been impractical to manufacture an optical system provided with such an optical path difference.

Further, when an optical path difference is provided between split beams, difference in the arrival time of each beam at the surface to be irradiated increases as the optical path difference is longer. Consequently, if the optical path difference provided between the split beams are too long, a semiconductor film would be irradiated with a beam which is delayed after the semiconductor area melted by irradiation with a beam which is not delayed is solidified. In that case, in a state where the crystal growth by irradiation with the split beam which is not delayed is finished, the next split beam is delivered; thus, a crystalline semiconductor film could not have been continuously grown and large crystal grains can not be formed. Further, in the case of crystallizing a semiconductor film by such an irradiation method, thermally discontinuous phenomenon is caused, which is completely different from a process flow in which irradiation is conducted with a laser beam having uniform energy distribution.

In view of the above problems, it is an object the present invention to provide a small laser beam irradiation apparatus in which beam interference is prevented while uniforming intensity of a beam cross section. Further, it is another object of the invention to provide a method for manufacturing a semiconductor device in which continuous crystal growth can be achieved in crystallizing an object to be irradiated.

A feature of the present invention is a method for manufacturing a semiconductor device, including splitting a laser beam into a plurality of split beams, providing an optical path difference between one split beam and the other split beam in a set of two arbitrary split beams selected from the plurality of split beams, and irradiating a common portion of a semiconductor film with the split beams in different periods respectively, thereby crystallizing the semiconductor film. Further, the laser beam is a pulsed laser beam having a pulse width of 100 fs to 1 ns at a repetition rate of 10 MHz or more, and the optical path difference has a length corresponding to the pulse width of the laser beam or more and less than a length equivalent to the coherence length or the pulse repetition interval.

A feature of the present invention is a method for manufacturing a semiconductor device, including splitting a laser beam into at least a first beam and a second beam, crystallizing a semiconductor film by irradiation a common portion of the semiconductor film with the split beams in different periods respectively. Further, an optical path difference is provided between a first optical path and a second optical path. The optical path difference has a length corresponding to the pulse width of the laser beam or more and less than a length corresponding to the coherence length or the pulse repetition interval. In addition, the laser beam is a pulsed laser having a pulse width of 100 fs to 1 ns at a repetition rate of 10 MHz or more.

A feature of the present invention is a method for manufacturing a semiconductor device, including splitting a laser beam into a plurality of split beams, providing a time lag between one split beam and the other split beam in a set of two arbitrary split beams selected from the plurality of split beams, and irradiating a common portion of a semiconductor film with the split beams in different periods respectively, thereby crystallizing the semiconductor film. Further, the laser beam is a pulsed laser having a pulse width of 100 fs to 1 ns at a repetition rate of 10 MHz or more, and the time lag of times at which the split laser beams reach the semiconductor film is a time corresponding to the pulse width of the laser beam or more and less than a time corresponding to the coherence length or the pulse repetition interval.

A feature of the present invention is a method of manufacturing a semiconductor device, including splitting a laser beam having a pulse width of 100 fs to 1 ns at a repetition rate of 10 MHz or more into a first laser beam and a second laser beam, delaying the second laser beam from the first laser beam, and irradiating a common portion of a semiconductor film with the first laser beam and the second laser beam in different periods respectively, thereby crystallizing the semiconductor film. Further, the semiconductor film is irradiated with the second laser beam while the semiconductor film is melted by irradiation with the first laser beam.

A feature of the present invention is a laser irradiation apparatus including a unit for splitting a laser beam emitted from an oscillation source, which has a pulse width of 100 fs to 1 ns at a repetition rate of 10 MHz or more into a plurality of split beams, a unit for providing an optical path difference between one split beam and the other split beam in a set of two arbitrary split laser beams selected from the plurality of split laser beams, and a unit for irradiating a common portion of an object to be irradiated with the split laser beams in different periods respectively. The unit for providing an optical path difference provides an optical path difference having a length equivalent to the pulse width of the laser beam or more and less than the coherence length or the pulse repetition interval.

Note that in this specification, a megahertz laser beam means a laser beam having an ultrashort pulse with a repetition rate of 10 MHz or more and a pulse width of 100 fs to 1 ns. Note that to irradiate a common portion with laser beams does not necessarily means that regions to be irradiated completely correspond to each other, but it is acceptable as long as the regions to be irradiated with the laser beams share a common portion.

An excimer laser having a pulse width of 25 ns to 200 ns is often used as a laser beam for crystallizing a semiconductor film. Such an excimer laser has somewhat long pulse width, so that it is suitable for a process which requires time for rearrangement of atoms like crystallization, and a crystal grain having a diameter of 100 nm to 300 nm approximately can be formed. On the other hand, in the case of using an ultrashort pulse laser having a pulse width of 1 ns or less, crystal grains do not grow to be sufficiently large because of the excessively short pulse width, which is inadequate for crystallization.

However, the present inventor found in an experiment that, by increasing the repetition rate thereby increasing the time for heating the semiconductor film and continuously supplying energy to the object to be irradiated, a crystal grain of a semiconductor film can be made sufficiently large even when an ultrashort pulse laser is used. That is the megahertz laser beam having a pulse width of 100 fs to 1 ns with a repetition rate of 10 MHz or more. In the invention, thermal energy necessary for crystallization is continuously supplied to a semiconductor film to crystallize the semiconductor film by using a repetition rate of 10 MHz or more even in the case of using an ultrashort pulse width of 100 fs to 1 ns.

In addition, the present inventors found that optical interference is suppressed by providing an optical path difference having a length of the pulse width or more. The invention is intended for suppressing optical interference of a megahertz laser by providing an optical path difference which is very short.

An ultrashort pulse laser is used for shape processing utilizing the high peak output. However, the laser beam used for shape processing is to form a hole or groove by instantaneously sublimating a part of the object to be irradiated instead of melting the object to be irradiated. Accordingly, the ultrashort pulse laser is different from a laser beam used for crystallizing a semiconductor film, and a laser beam having higher energy than a laser beam used for crystallization is used.

It is a feature of the present invention to provide an optical path difference or time lag between split beams. Providing an optical path difference and providing a time lag have the same meaning in differentiating the timing of the split beams reaching a surface to be irradiated. However, in this specification, one expressed in length refers to an optical path difference, and the other expressed in time refers to a time lag.

In the present invention, a megahertz laser beam is split and an optical path difference equivalent to the length between the pulse width of a megahertz laser beam and the coherence length the split beams, thereby preventing interference between the split beams. Alternatively, a time lag corresponding to the pulse width of a megahertz laser beam or more between the split beams, thereby preventing interference between the split beams. Thus, even a slight optical path difference (time lag) allows a uniform thermal energy distribution of an object to be irradiated without optical interference. Consequently, there are advantages that an optical system for providing an optical path difference can also be reduced in size, and a laser irradiation apparatus can be made smaller.

When the repetition rate is set at 10 MHz or more, heat can be continuously applied to a semiconductor film, which allows continuous crystal growth. Further, when the pulse width is 1 ns or less, an optical path difference between the split beams can be 10 cm or less, so that an optical system which can be practically designed can be manufactured. In addition, when the pulse width is 100 fs or more, the structure of the laser apparatus can be made simple, which is industrially advantageous.

In the case of a megahertz laser beam having a repetition rate of 10 MHz or more and a pulse width of 100 fs to 1 ns, when the length corresponding to the pulse width and the coherence length are compared, the length corresponding to the pulse width is shorter. Therefore, the present invention is effective because the interference can be reduced using a very short optical path difference.

Further, in the present invention, an optical path difference between split laser beams is short, so that a semiconductor film can be continuously irradiated even with split laser beams with less interference. Accordingly, a crystal having large grain sizes can be formed by continuously growing a crystal of the semiconductor film. In other words, when a megahertz laser beam is split to a first beam and a second beam, the semiconductor film melted by the first beam can be irradiated with the second beam before it is solidified.

In addition, the present invention allows crystallization of a semiconductor film even with a laser beam having an ultrashort pulse width of 100 fs to 1 ns by setting the repetition rate at 10 MHz or more.

Accordingly, in the present invention, an object to be irradiated can be irradiated with a laser beam by which a uniform thermal energy distribution of the object to be irradiated without optical interference. In addition, when the object to be irradiated is a semiconductor film, a crystal of the semiconductor film can be continuously grown during application of split beams, thereby obtaining a uniform crystal with large grain size.

BRIEF DESCRIPTION OF THE DRAWINGS

In the accompanying drawings:
FIGS. 2A to 2C are figures for explaining Embodiment Mode 1;
FIGS. 5A to 5I are figures for explaining Embodiment 1;
FIGS. 7A and 7B are figures for explaining Embodiment 2.

DETAILED DESCRIPTION OF THE INVENTION

Embodiment Mode

Embodiment Modes and Embodiments will be described with reference to the drawings. However, since the present invention can be embodied in many different modes, it is understood by those skilled in the art that the modes and details can be variously changed without departing from the spirit and scope of the present invention. Therefore, the present invention should not be construed as being limited to the description of this embodiment mode.

Further, Embodiment Modes 1 and 2 described below can be freely combined as long as it is practical.

Embodiment Mode 1

Figure 1A:
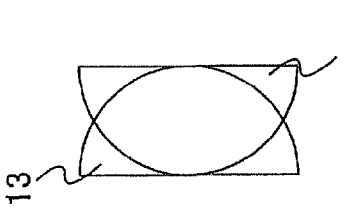
FIGS. 1A to 1H are figures for explaining Embodiment Mode 1.
Figure 1B:
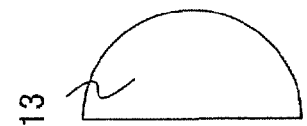
Figure 1C:
Figure 1D:
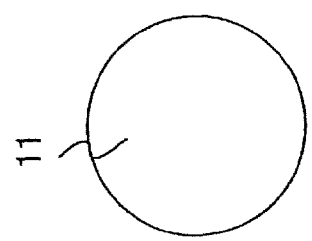
Figure 1E:
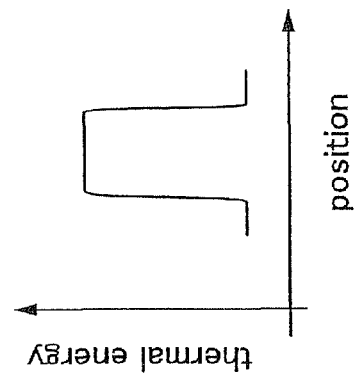
Figure 1F:
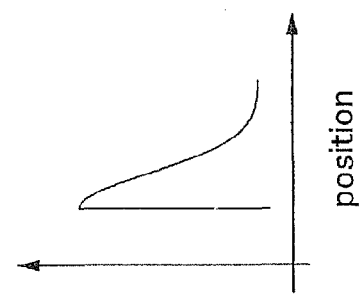
Figure 1G:
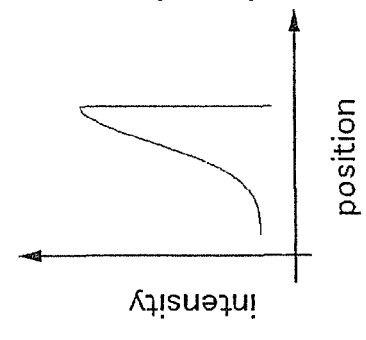
Figure 1H:
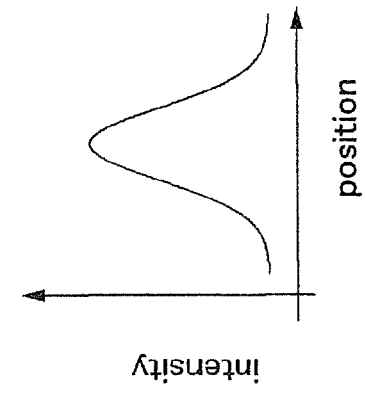

FIGS. 1A to 1H show shapes of a beam cross section of a megahertz laser beam which has been split and supplied to a common portion of an object to be irradiated in different periods respectively, intensity distributions and thermal energy distributions. FIG. 1A shows the beam cross section of a megahertz laser beam before splitting, FIG. 1B and FIG. 1C show beam cross sections of megahertz laser beams being split, and FIG. 1D shows the beam cross section of a megahertz laser beam supplied to the common portion of the object to be irradiated in different periods respectively. FIG. 1E shows the intensity distribution of the beam cross section before splitting, FIGS. 1F and 1G shows the intensity distribution of the split beam cross section of the split beams, FIG. 1H shows the thermal energy distribution which is supplied to the common portion applied with the split beams in different periods respectively. Here, a megahertz laser beam is split into two beams; however, it may be split into any number of beams as long as it is two or more. The more the number of the split beams, the more uniform the energy distribution made by the split beams becomes. Note that the shapes of the beam cross sections shown in FIGS. 1A to 1D, the intensity distribution shown in FIGS. 1E and 1F and the thermal energy distribution shown in FIG. 1H are only examples and the invention is not limited thereto.

The cross section of the beam 11 is circular, and the intensity distribution has Gaussian distribution (FIGS. 1A and 1E). The beam 11 is split into beams 12 and 13, which have semicircular beam cross sections, and the intensity distribution has an axisymmetric Gaussian distribution as divided in half (FIGS. 1B, 1C, 1F, and 1G). Then, the split beams 12 and 13 are applied to the common portion of the object to be irradiated in different periods respectively so as to supply a uniform thermal energy distribution to the common portion of the object to be irradiated (FIGS. 1D and 1H). As described above, when a beam is split and applied to a common portion of an object to be irradiated in different periods respectively, nonuniformity of the energy distribution supplied to the common portion of the object to be irradiated can be reduced.

However, when the split beams 12 and 13 are applied to the common portion of the object to be irradiated at the same time, interference is newly caused; thus, as shown in FIGS. 2A and 2B, it is necessary to provide a time lag at which the split beams 12 and 13 respectively reach the object to be irradiated.

FIG. 2A shows a megahertz laser beam having a pulse repetition interval of 12.5 ns as an example of a megahertz laser beam. As shown in FIGS. 1A to 1H, the spatial profile of the beam 11 is divided in half to form the split beams 12 and 13 (FIG. 2B). Then, as shown in FIG. 2C, the split beams 12 and 13 are delayed for a time corresponding to a certain optical path difference (time lag) in order to reduce the interference when the split beams are applied to the common portion of the object to be irradiated. The time lag here is to be the pulse width of the beam 11 and less than the pulse repetition interval. When the time lag is less than the pulse width, the pulses of the split beams 12 and 13 overlap, so that optical interference would be caused. Meanwhile, when the time lag is equivalent to the pulse repetition interval of the beam 11, the pulse periodically delivered from a laser source and a pulse of the delayed split beam 13 overlap, which causes interference. Further, when the time lag is equivalent to the pulse repetition interval of the beam 11 or more, an optical path difference of 3 m or more is necessarily provided, which is impractical. Therefore, the time lag is required to be shorter than the pulse repetition interval. Accordingly, by setting the above time lag for the split beams, the surface to be irradiated can be irradiated with a uniform laser beam without optical interference. Further, in the case of splitting the beam 11 into 3 or more beams, whichever of a set of two beams arbitrarily selected from the split beams has the same relationship as the split beams 12 and 13 described above. In other words, as to a set of two split beams arbitrarily selected from the split beams, one split beam is delayed from the other split beam for a time corresponding to the pulse width or more and less than pulse repetition interval.

Strictly, the maximum of the time lag to be provided equals the time of the pulse repetition interval minus the pulse width. In other words, the time lag $t_d$, the pulse width a, and the pulse repetition interval 1/N (N is the repetition rate of the laser beam) has the relation of $a<t_d<1/N-a$.

In this specification, a pulse repetition interval refers to 1/N under the condition that the repetition rate of a megahertz laser beam is N.

When an object to be irradiated is irradiated with the split beam 12, the optical energy is converted into thermal energy. The thermal energy distribution here reflects the intensity distribution of the split beam 12. However, in the case where the optical path difference between the split beams is overly long, thermal energy supplied to the object to be irradiated begins to scatter before applying the split beam 13, and the thermal energy distribution would change. Accordingly, uniform thermal energy distribution cannot be obtained even when the split beam 13 is applied and the thermal energy distribution supplied by applying the split beam 13 is combined with the thermal energy distribution supplied by applying the split beam 12. In other words, the object to be irradiated cannot be uniformly irradiated with a laser beam. Therefore, it is preferable to apply the split beam 13 before the thermal energy generated by the split beam 12 scatters.

In the present invention, an optical path difference is less than a length equivalent to the pulse width of a megahertz laser beam or more and less than the length corresponding to the pulse repetition interval; thus, the optical path difference can be very short, and the split beam 13 can be applied before the thermal energy of the split beam 12 scatters. Consequently, uniform energy can be more reliably supplied to the surface to be irradiated.

Further, in the case where optical interference is reduced by providing an optical path difference of the coherence length or more as is conventional, since the provided optical path difference is long, the energy of the split beam 13 decays before the energy of the split beam 13 reaches the surface to be irradiated; thus, efficiently the laser can not be applied sufficiently. Besides, when the optical path difference is long, the split beam 13 would be applied after the energy supplied by the irradiation with the split beam 12 is scattered; thus, uniform energy can not be supplied to the object to be irradiated continuously with split beams. For example, in the case of crystallizing a semiconductor by laser irradiation, the split beam 13 is applied after the semiconductor melted by irradiation with the split beam 12 is solidified, and a crystal of the semiconductor can not be grown continuously with the split beams, so that a crystal having large grains can not be obtained.

In contrast, in the present invention, even when an optical path difference is provided between split beams, the optical path difference is short to have a length equivalent to the pulse width of a megahertz laser or more, the split beams can be continuously applied with less energy decay. Further, energy can be continuously supplied to the surface to be irradiated with the split beams, and high energy can be efficiently supplied to the surface to be irradiated with less optical interference. Consequently, in the case of applying the present invention to a crystallization of a semiconductor, continuous crystal growth can be realized, and a crystal having large grains can be obtained.

Note that a length corresponding to the pulse width in the present invention equals to a value of the pulse width multiplied by the velocity of light, and a length corresponding to a pulse repetition interval equals to value of the pulse repetition interval multiplied by the velocity of light.

Figure 18A:
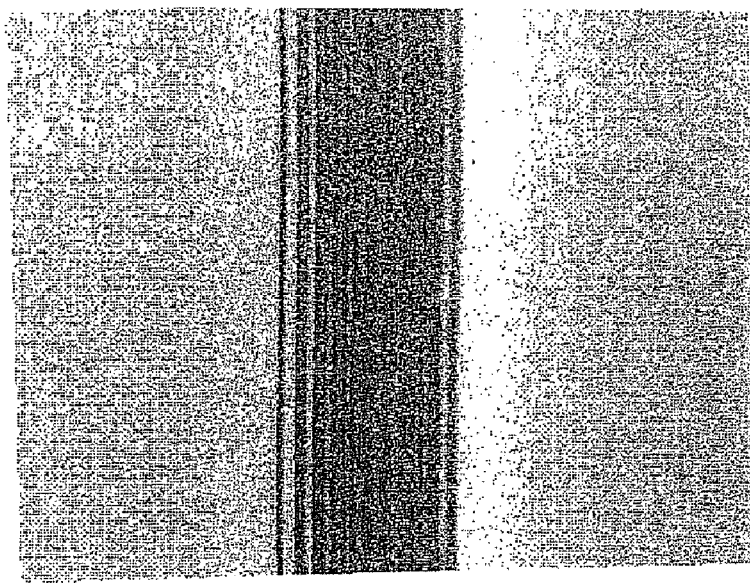
FIGS. 18A and 18B each show a micrographs of a megahertz laser beam.
Figure 18B:
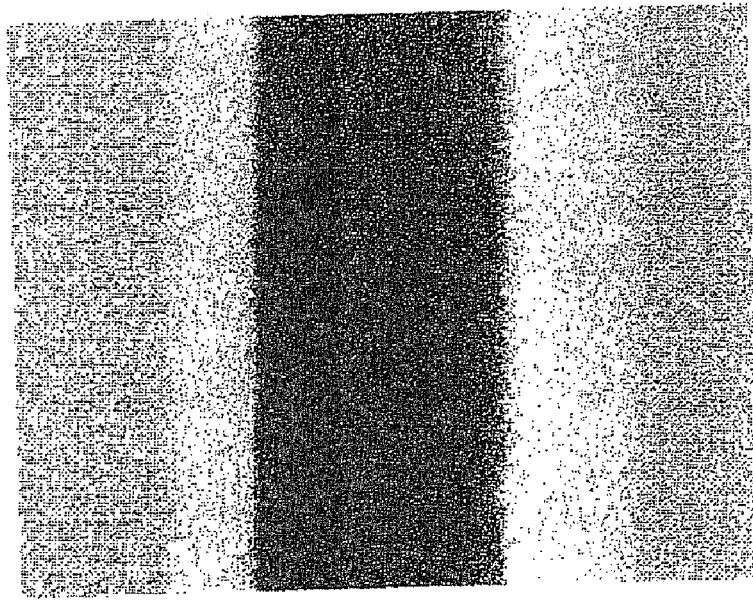

FIGS. 18A and 18B show micrographs of silicon. The silicon is crystallized by a YVO$_4$ laser having a pulse width of 15 ps at a repetition rate of 80 MHz from an amorphous silicon. In both FIGS. 18A and 18B, a YVO$_4$ laser beam is split and applied to a common portion of silicon in different periods respectively, FIG. 18A shows the case of crystallization using split beams without time lag, and FIG. 18B shows the case of crystallization using split beams with a time lag of about 25 ps.

In a micrograph shown in FIG. 18A, periodic interference fringes are clearly seen. Meanwhile, in FIG. 18B, a uniform crystal state is seen without no interference fringe.

As described above, the present invention makes it possible to crystallize a semiconductor film with a megahertz laser beam which can supply a uniform thermal energy distribution by providing a very short optical path difference and thus eliminating optical interference between the split beams.

Embodiment Mode 2

In this embodiment mode, a mode in which an object to be irradiated over a glass substrate or a quartz substrate is irradiated with a laser beam will be described. In the case where an object to be irradiated is over a glass substrate or a quartz substrate, a laser beam which is not absorbed by the object to be irradiated may be reflected by the back face of the substrate and delivered again to the object to be irradiated. In that case, behavior of the light reflected from the back face of the substrate is necessarily considered when the optical path difference is determined to prevent the optical interference. In this embodiment mode, wetting of the optical path difference in consideration of light reflected by the back face of the substrate will be described with reference to FIG. 3A to FIG. 4D. Note that the time lag $t_d$ is less than a repetition interval of 1/N of the laser beam. It is because when the pulse repetition is set at the pulse repetition interval of the laser beam or more, an optical path difference equivalent to 3 m or more using a conventional technology, which is impractical. Another reason is that when the time lag equals the pulse repetition interval of the laser beam, the pulses emitted periodically from a laser source and the decayed split pulses overlap, thereby causing interference.

In FIGS. 3A to 4D, one of two split beams produced by splitting a megahertz laser beam is a first laser beam 401, and the other split beam is a second laser beam 402. Alternatively, in the case of dividing the megahertz laser beam into a plurality of beams, arbitrary two laser beams among the plurality of split beams are used as a set. Further, one of the two laser beams, which is applied first, is a first laser beam 401, and the other split beam applied later is a second laser beam.

In the case of applying the first laser beam 401 and the second laser beam 402, the conditions for preventing interference between the first and second laser beams on an object to be irradiated 403 over the substrate 404 can be classified into the following three in accordance with the times $t_1$ to $t_3$ in which the first laser beam 401 propagates through the substrate 404. Note that, in this embodiment mode, an amorphous silicon film is used as the object to be irradiated 403, and a glass substrate is used as the substrate 404.

Figure 3A:
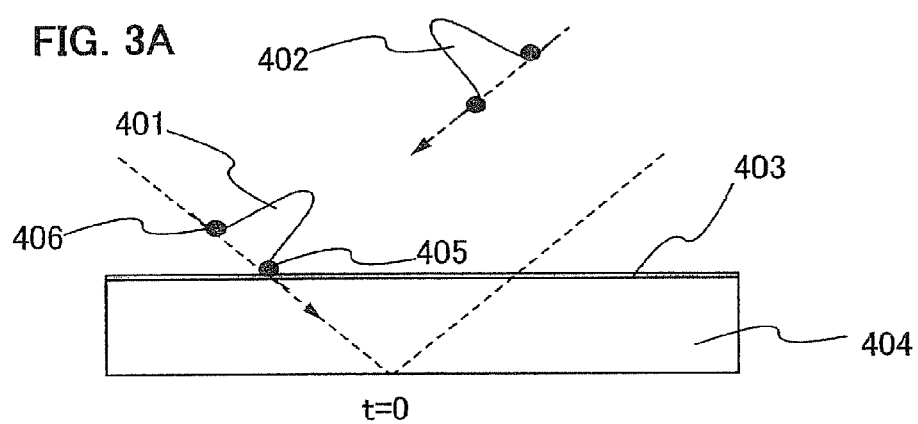
FIGS. 3A to 3D are figures for explaining Embodiment Mode 2.

The case in which the second laser beam 402 which is delayed is applied on the object to be irradiated 403 after the first laser beam 401 passes through the object to be irradiated 403, reflects off the back face of the substrate 404, and passes through the object to be irradiated 403 again will be explained with reference to FIG. 3. FIG. 3A shows a moment at which the object to be irradiated 403 is irradiated with the first laser beam 401, and a pulsetip 405 of the first laser beam 401 reaches the object to be irradiated 403. The time here is t=0.

Figure 3B:
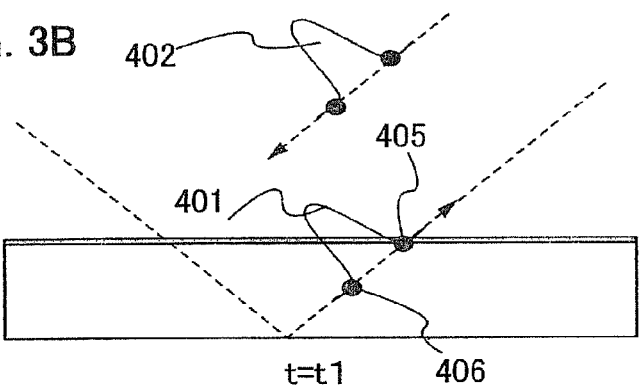

FIG. 3B shows a state after a lapse of $t_1$ seconds from the state shown in FIG. 3A. FIG. 3B shows the state where the pulsetip 405 of the first laser beam 401 passes through the object to be irradiated 403, reflects off the back face of the substrate, and applied again on the object to be irradiated 403. Here, the time $t_1$ in which the pulsetip 405 of the first laser beam propagates through the substrate 404 is represented as $t_1=2nD/c$ when the thickness of the substrate is D, the refractive index of the substrate is n, and the velocity of light is c.

Figure 3C:
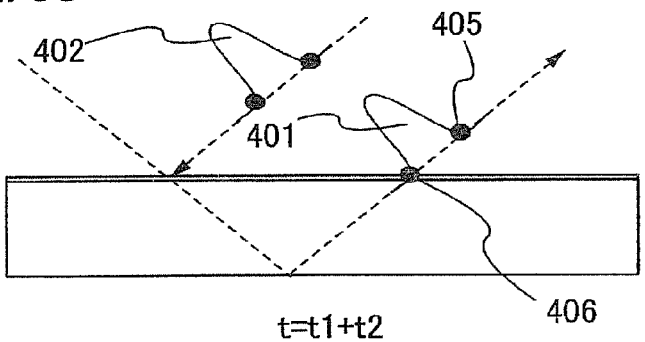

Next, FIG. 3C shows a state after a lapse of $t_2$ seconds from the state shown in FIG. 3B. FIG. 3C shows the state where a pulse end 406 of the first laser beam 401 passes through an object to be irradiated 403, and $t_2$ is corresponding to the pulse width of the first laser beam 401. In the state shown in FIG. 3C, the object to be irradiated 403 keeps phase information of the first laser beam 401.

Figure 3D:
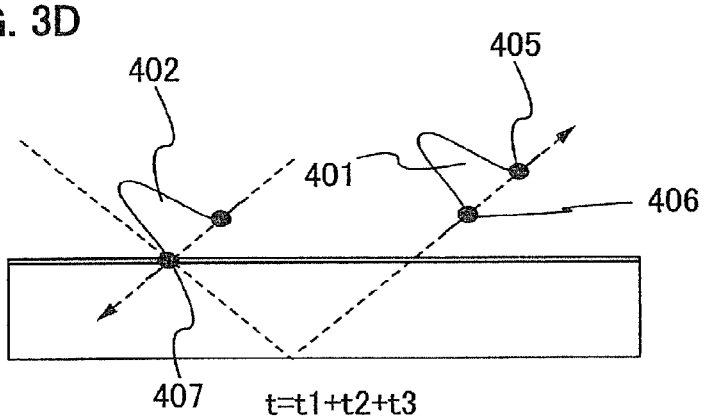

Next, FIG. 3D shows a state after a lapse of $t_3$ seconds, which is a phase relaxation time, from the state shown in FIG. 3C. In FIG. 3D, the object to be irradiated 403 does not keep phase information of the first laser beam 401. Therefore, even when the object to be irradiated 403 is irradiated with the second laser beam 402, interference between the first laser beam 401 and the second laser beam 402 does not occur. Hereupon, from the time when the object to be irradiated 403 is irradiated with the first laser beam 401 (the state shown in FIG. 3A) to the time when the object to be irradiated 403 is irradiated with the second laser beam 402 (the state shown in FIG. 3D) equals to $t_1+t_2+t_3$. Therefore, in order to reduce the optical interference between the first laser beam and the second laser beam, the time lag between the first laser beam 401 and the second laser beam 402 is required to be longer than the above time $t_1+t_2+t_3$. Accordingly, the following Equation 1 holds.

$$t_1+t_2+t_3<t_d \quad \text{(Equation 1)}$$

Note that since laser pulses are emitted from a laser oscillator at a repetition interval of 1/N seconds (N is the frequency of a laser beam), it is necessary to consider not only the difference between the second laser beam 402 and the first laser beam 401, but also the difference between the second laser beam 402 and the third laser beam which is emitted after a lapse of 1/N seconds from the first laser beam 401. Correspondingly, it is preferable that the third laser beam emitted after 1/N seconds from the first laser beam 401 reaches after the phase information due to the second laser beam 402 is eliminated in the object to be irradiated 403. In other words, the third laser beam is preferably applied after the second laser beam 402 reflects off the back face of the substrate, irradiates the object to be irradiated 403 again, and passes through the object to be irradiated 403. In FIG. 3, the time in which the first laser beam 401 irradiates the object to be irradiated 403, the second laser beam 402 reflects off the back face of the substrate, and passes through the object to be irradiated 403 again is expressed as $t_d+t_1+t_2+t_3$. Here, if the repetition interval 1/N of a laser pulse is longer than the above time $t_d+t_1+t_2+t_3$, the second laser beam 402 and the third laser beam does not overlap the object to be irradiated 403 in time, so that interference between laser beams can be prevented. In accordance with the above condition, the time lag $t_d$ can be expressed by Equation 2 below.

$$t_d<1/N-t_1-t_2-t_3 \quad \text{(Equation 2)}$$

When Equation 1 and Equation 2 are put together, the condition of the time lag $t_d$ where the interference between the first laser beam 401 and the second laser beam 402 can be prevented can be expressed by Equation 3 below.

$$t_1+t_2+t_3<t_d<1/N-t_1-t_2-t_3 \quad \text{(Equation 3)}$$

Note that a phase relaxation time is a time from when the laser beam is absorbed by the object to be irradiated, to when the phase information of the laser beam amounts to 1/e (e is a natural number). Accordingly, the above phase relaxation time $t_3$ is a time from when the first laser beam 401 is absorbed by the object to be irradiated 403 to when the phase information amounts to 1/e. However, the time is extremely short compared with the pulse width, so that the time may be considered as $t_3 \approx 0$. Accordingly, Equation 3 can be expressed as in Equation 4.

$$t_1+t_2<t_d<1/N-t_1-t_2 \quad \text{(Equation 4)}$$

In other words, when a time lag $t_d$ satisfying the above Equation 3 or Equation 4 is provided between the first laser beam 401 and the second laser beam of the split beams, the object to be irradiated can be irradiated with the second laser beam 402 without interference with the first laser beam 401 reflected by the back face of the substrate. A time lag (optical path difference) is provided by calculating $t_d$ from the values of $t_1$: 2 nD/c, $t_2$: a pulse width, and 1/N: a pulse repetition interval. When a megahertz laser beam is split into three or more beams, among the split beams, time lag $t_d$ satisfying the above Equation 3 or Equation 4 is provided between a set of two arbitrary split beams, thereby preventing interference.

As described above, in the case of considering the light reflected by the back face of the substrate, the pulse width $t_2$ plus the time $t_1$ during which the first laser beam propagates through the substrate may be used as the minimum value of the time lag (optical path difference). Further, the repetition interval minus the time $t_1$ during which the first laser beam propagates through the substrate as well as the pulse width $t_2$ is to be used as the maximum of the time lag (optical path difference).

Using Equation 3 or Equation 4 obtained as above, the time lag $t_d$ between the first laser beam and the second laser beam can be determined, so that an optical path difference required for an optical system can be calculated. For example, when a pulse width $t_2$ of a laser beam emitted from laser oscillator 101 is 10 ps, a phase relaxation time $t_3$ of the object to be irradiated 403 which is a surface to be irradiated is 0.1 ps, the thickness of a substrate is 1 mm, and the refractive index of the substrate is 1.5; $t_1+t_2+t_3=20.1$ ps is satisfied. When the time lag $t_d$ between the laser beams is 20.1 ps or more in accordance with Equation 3, optical interference on the surface to be irradiated can be prevented. Further, the maximum of the time lag $t_d$ can be calculated from $1/N-t_1-t_2-t_3$. In the case where the pulse repetition interval 1/N is 10 ns, the maximum of the delay time is 9.98 ns, optical interference can be prevented when the time lag $t_d$ is set at 20.1 ps to 9.98 ns.

Note that when an object to be irradiated is crystallized by a megahertz laser beam, a time lag $t_d$ within a set time of the object to be irradiated is preferably provided. When the delay time is set within the set time, the object to be irradiated can be continuously irradiated with the first laser beam and the second laser beam, so that continuous crystal growth using split beams can be realized. Therefore, the time lag $t_d$ may preferably be adjusted fitly by a practitioner in accordance with the melting time of the object to be irradiated in the range of Equation 3 or Equation 4. For example, the set time of silicon is 100 ns, so that a crystal of silicon can be continuously grown by setting the time lag $t_d$ within 100 ns.

Next, another example of preventing interference between the first laser beam and the second laser beam will be described with reference to FIG. 4. The same components as FIG. 3 are denoted by the same marks and symbols as the FIG. 3.

Figure 4A:
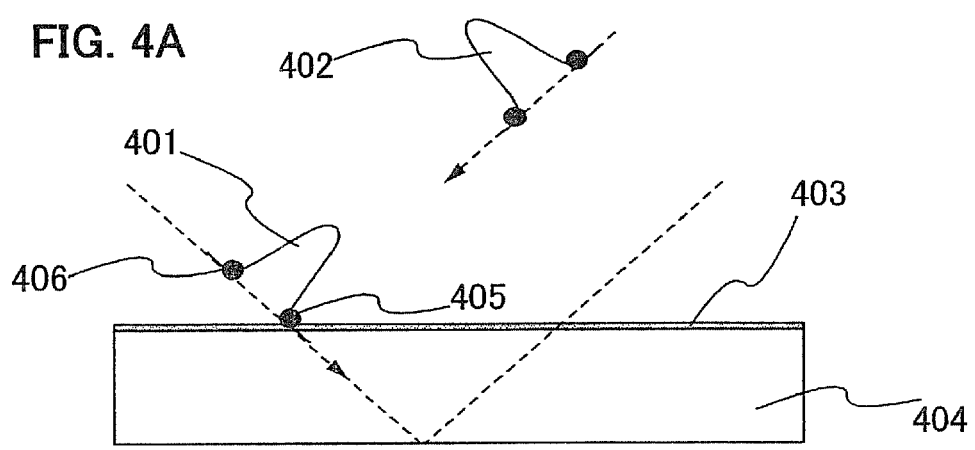
FIGS. 4A to 4D are figures for explaining Embodiment Mode 2.

FIGS. 4A to 4D show the case where the object to be irradiated 403 is irradiated with the second laser beam 402 while the first laser beam 401 passes through the object to be irradiated 403 and light reflected by the back face of a glass substrate irradiates the object to be irradiated 403 again. In FIG. 4A shows a state where the object to be irradiated 403 is irradiated with the first laser beam 401 and the time t=0. Here, a pulsetip 405 of the first laser beam 401 reaches the object to be irradiated 403.

Figure 4B:
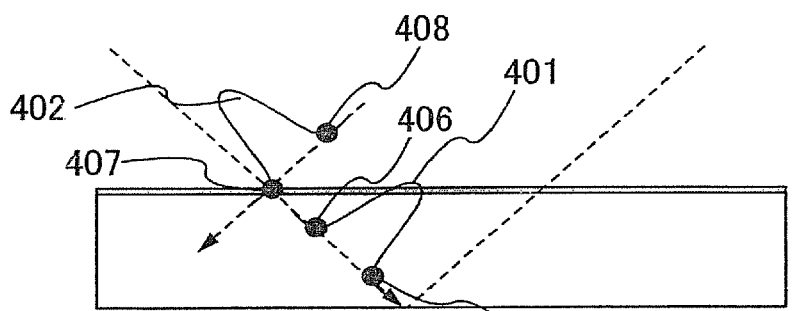

A time lag between the first laser beam 401 and the second laser beam 402 is set as $t_d$. A pulsetip 407 of the second laser beam 402 reaches the object to be irradiated 403 after a lapse of $t_d$ seconds. The state is shown in FIG. 4B. At this point of time, in order to prevent interference between the first laser beam 401 and the second laser beam 402, it is necessary to irradiate the object to be irradiated 403 with the second laser beam 402 after a pulse end 406 of the first laser beam 401 passes through the object to be irradiated 403, and the phase information of the first laser beam 401 is eliminated. Therefore, time lag $t_d$ between the first laser beam 401 and the second laser beam 402 can be expressed by Equation 5 below using a pulse width of $t_2$, and a phase relaxation time of $t_3$.

$$t_2+t_3<t_d \quad \text{(Equation 5)}$$

Figure 4C:
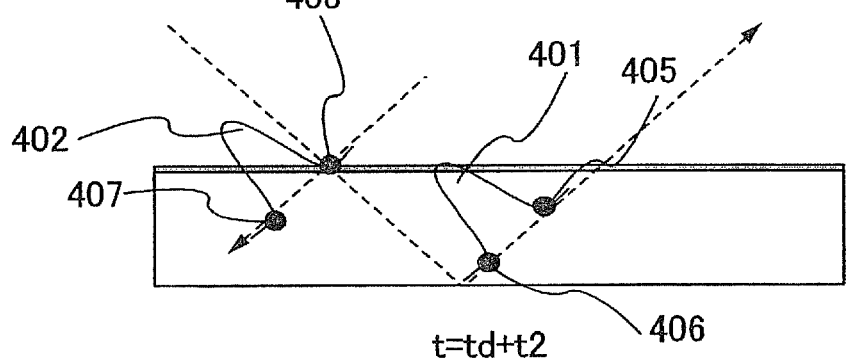

FIG. 4C shows a figure of a state after a lapse of the pulse width $t_2$ seconds of the second laser beam 402 from the state shown in FIG. 4B, where a pulse end 408 of the second laser beam 402 passes through the object to be irradiated 403.

Figure 4D:
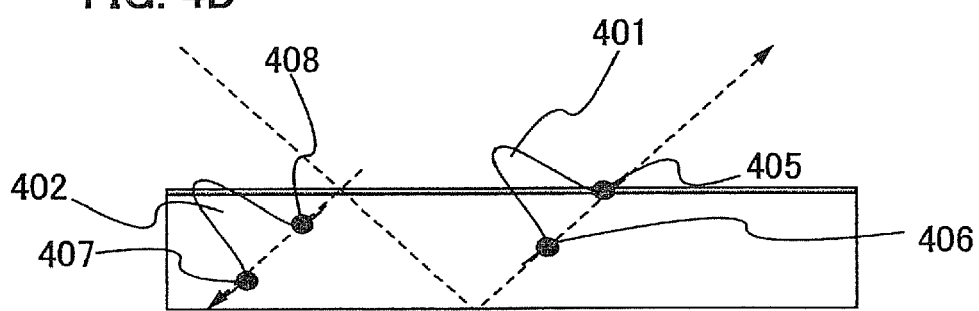

After a lapse of phase relaxation time $t_3$ from a state shown in FIG. 4C, phase information of the object to be irradiated 403 due to the second laser beam 402 is eliminated. The state of this time is shown in FIG. 4D. After the phase information of the second laser beam is eliminated, if the first laser beam 401 reflected by the back face of the substrate irradiates the object to be irradiated 403 again, interference between the first laser beam 401 and the second laser beam 402 is not caused. Note that time from when the object to be irradiated 403 is irradiated with the pulsetip 405 of the first laser beam 401 (FIG. 4A) to when the object to be irradiated 403 is irradiated with the pulsetip 405 again (FIG. 4D) is denoted by $t_1$ as shown in FIGS. 3A to 3D. Therefore, Equation 6 below can be used in order to satisfy the condition under which interference does not occur in the states shown in FIGS. 4A to 4D.

$$t_d + t_2 + t_3 < t_1 \quad \text{(Equation 6)}$$

When Equation 5 and Equation 6 are put together, the condition where the interference between the first laser beam 401 and the second laser beam 402 can be prevented can be expressed by Equation 7 below.

$$t_2 + t_3 < t_d < t_1 - t_2 - t_3 \quad \text{(Equation 7)}$$

Finally, a case where the object to be irradiated 403 is irradiated with third laser beam emitted after a lapse of 1/N seconds from the first laser beam 401 while the second laser beam 402 passes through the object to be irradiated 403 and reflects off the back face of the substrate, and the reflected light irradiates the object to be irradiated 403 again. The time from when the object to be irradiated 403 is irradiated with the first laser beam 401 (FIG. 4A), to when the object to be irradiated 403 is irradiated with the second laser beam 402, and the phase information of the object to be irradiated 403 due to the second laser beam 402 is eliminated (FIG. 4D) is expressed by $t_d + t_2 + t_3$. Here, in the case where the repetition interval 1/N of the laser pulse is longer than the above time $t_d + t_2 + t_3$, the second laser beam 402 and the third laser beam do not overlap on the object to be irradiated 403 in time; thus, interference between the laser beams can be prevented. With the above relationship, Equation 8 below with respect to the time lag $t_d$ is obtained.

$$t_d < 1/N - t_2 - t_3 \quad \text{(Equation 8)}$$

Further, the time during which the object to be irradiated 403 is irradiated with the first laser beam 401, the object to be irradiated 403 is irradiated with the third laser beam, and the phase information of the object to be irradiated 403 due to the third laser beam is eliminated is expressed by $1/N + t_2 + t_3$. In the case where the second laser beam 402 reflected by the back face of the substrate reaches the object to be irradiated 403 after a lapse of the above time $1/N + t_2 + t_3$, the third laser beam and the second laser beam do not overlap on the object to be irradiated 403 in time; thus, interference between the laser beams can be prevented. Note that the time during which the object to be irradiated 403 is irradiated with the first laser beam 401, the object to be irradiated is irradiated with the second laser beam, and the second laser beam reflected by the back face of the substrate reaches the object to be irradiated 403 is expressed by $t_d + t_1$. Therefore, when Equation 9 below holds, after the phase information of the third laser beam is eliminated from the object to be irradiated 403, the second laser beam reflected by the back face of the substrate irradiates the object to be irradiated again, thereby preventing interference.

$$1/N + t_2 + t_3 < t_d + t_1 \quad \text{(Equation 9)}$$

When Equation 8 and Equation 9 are put together, the condition where the interference between the third laser beam emitted after a lapse of 1/N seconds from the first laser beam and the second laser beam 402 can be prevented can be expressed by Equation 10 below.

$$1/N - t_1 + t_2 + t_3 < t_d < 1/N - t_2 - t_3 \quad \text{(Equation 10)}$$

Note that, phase relaxation time $t_3$ is a time from when the first or second laser beam is absorbed by the object to be irradiated 403 to when the phase information becomes 1/e as in FIG. 3. However, the time is extremely short, so that the time may be considered as $t_3 \approx 0$. Accordingly, Equation 10 can be expressed as in Equation 11 below.

$$1/N - t_1 + t_2 < t_d < 1/N - t_2 \quad \text{(Equation 11)}$$

In the case of splitting a megahertz laser beam into 3 or more beams, among the split beams, time lag $t_d$ satisfying the above Equation 10 or Equation 11 is provided between a set of two arbitrary split beams, thereby preventing interference.

Note that when an object to be irradiated is crystallized by a megahertz laser beam, time lag $t_d$ within a set time of the object to be irradiated is preferably provided. When the delay time is set within the set time, the object to be irradiated can be continuously irradiated with the first laser beam and the second laser beam, so that continuous crystal growth using split beams can be realized. Therefore, the time lag $t_d$ may preferably be adjusted fitly by a practitioner in accordance with the melting time of the object to be irradiated in the range of Equation 10 or Equation 11.

A time lag $t_d$ is calculated from the Equations above, and an optical system may be designed to use the obtained optical path difference. Thus, an optical path difference can be designed considering the behavior of light reflected by the back face of the substrate as well. By providing an optical path difference according to the invention, an amorphous silicon film can be irradiated to supply a uniform thermal energy distribution without optical interference, thereby continuous crystal growth can be performed. In other words, in order to uniformly irradiating a semiconductor film without optical interference, it is acceptable as long as two laser beams are not in a semiconductor film, and phase information of two laser beams is not in the semiconductor film accordingly.

In this embodiment, time lag $t_d$ is explained using time as a unit; however, in the case of converting it into optical path difference, the delay time may be multiplied by velocity of light.

Embodiments 1 to 8 below can be freely combined as long as it is practical. Further, Embodiment 1 to 8 below can be freely combined with Embodiment Mode 1 or 2 as long as it is practical.

Embodiment 1

In Embodiment 1, a laser irradiation apparatus of the present invention will be described. FIG. 5A shows a laser irradiation apparatus, FIG. 5B shows a shape of a beam cross section before splitting, FIGS. 5C and 5D show shapes of cross sections of split beams, and FIG. 5E shows a cross section of the split beams applied to a common portion of a surface to be irradiated in different periods respectively. FIG. 5F shows intensity distribution of a cross section of a beam before splitting, FIGS. 5G and 5H each show intensity distribution of a cross section split beams, and FIG. 5I shows thermal energy distribution of the surface to be irradiated with the split beams in different periods respectively.

In FIG. 5A, a laser beam 107 emitted from a laser oscillator 101 is split into a first laser beam 108 and a second laser beam 109 by a splitter. The laser beams 107, 108, and 109 are megahertz laser beams. As the splitter 102 a split mirror is used. The laser beam 107 has a circular beam cross section and intensity of Gaussian distribution (FIGS. 5B and 5F). The first laser beam 108 and the second laser beam 109 are split by the split mirror to have semicircular beam cross sections (FIGS. 5C and 5D). The luminous intensities has distributions of Gaussian distribution divided in half, which are axisymmetric (FIGS. 5G and 5H).

The first laser beam 108 and the second laser beam 109 reflect off a mirror 104 and a mirror 103 respectively to be polarized, and the first laser beam 108 and the second laser beam 109 are applied to the common portion of the surface to be irradiated in different periods respectively. The first laser beam 108 and the second laser beam 109 are applied to the common portion of the surface to be irradiated in different periods respectively so that nonuniformity of the thermal energy distribution supplied to the common portion of the surface to be irradiated is reduced as shown in FIGS. 5E and 5I.

When an optical path length d1 from the splitter 102 to the mirror 104 and an optical path length d2 from the splitter 102 to the mirror 103 are compared, d1<d2 is satisfied, and the difference between the optical path lengths (d=d2−d1) is an optical path difference between the first laser beam 108 and the second laser beam 109. Further, an optical path difference d is set to have a length corresponding to the pulse width of the laser beam 107 or more and less than a length corresponding to the pulse repetition interval. In this embodiment, since a megahertz laser beam is used, the optical path difference d may be several mm to several tens mm, and a long optical path difference is not required to be provided. For example, when a pulse width is 10 ps, the optical path difference d is 3 mm, which is very short optical path difference.

Further, as in Embodiment Mode 2, in the case of considering light reflected by the back face of the substrate, optical path difference d in which $t_d$ calculated from the Equation is multiplied by velocity of light may be set.

Figure 6:
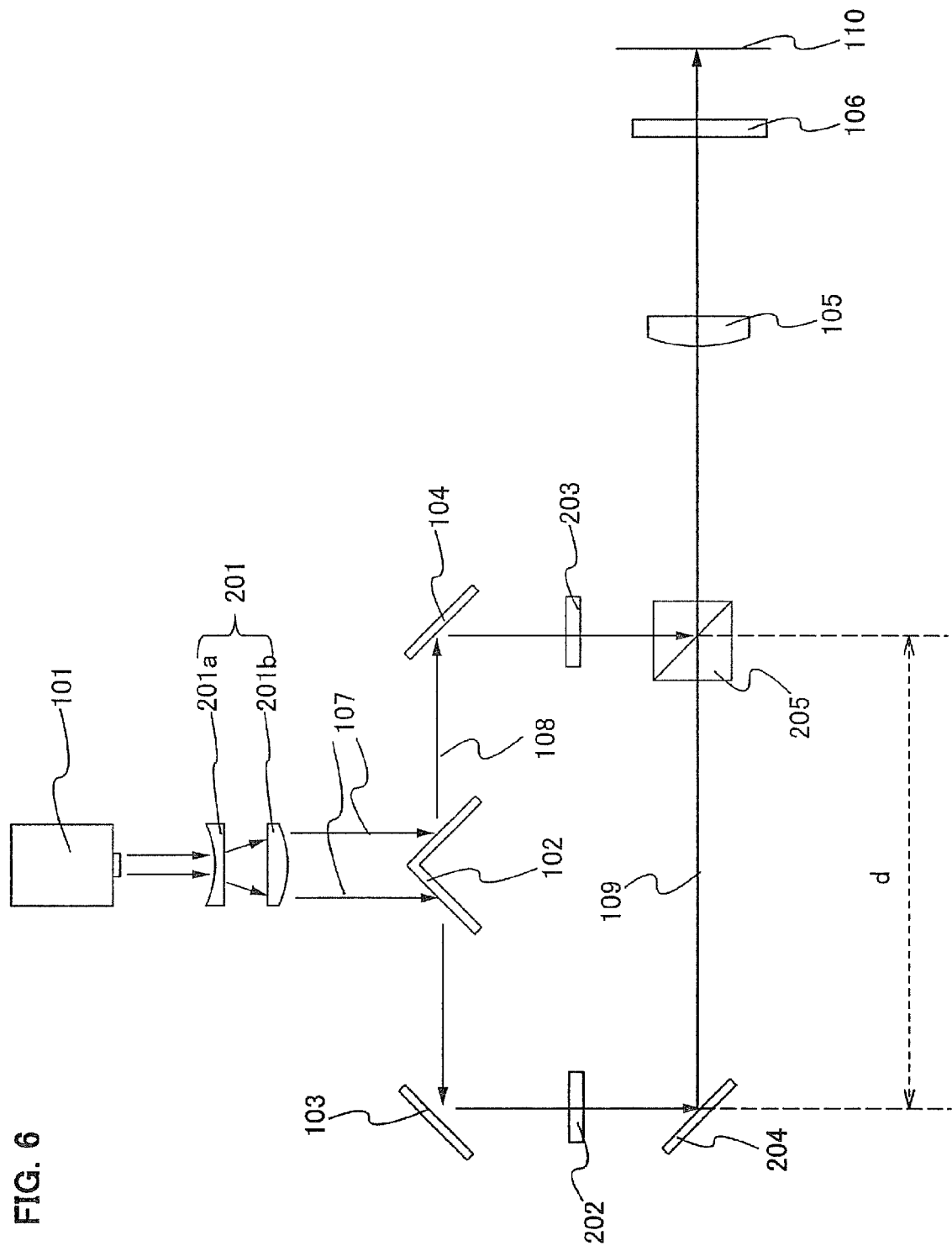
FIG. 6 is a figure for explaining Embodiment 1.

Next, an example of using a laser irradiation apparatus in which a half wave plate and a beam splitter for will be described with reference to FIG. 6. The same components as in FIG. 5A are denoted by the same marks.

A laser beam 107 output from a laser oscillator 101 megahertz laser beam is expanded approximately five times in both a longitudinal direction and a transverse direction by beam expander 201 including spherical lenses 201a and 201b. The spherical lens 201a has a radius of 50 mm and a thickness of 7 mm, and the curvature radius of a first surface is −220 mm. The spherical lens 201b has a radius of 50 mm and a thickness of 7 mm, and the curvature radius of a second surface is −400 mm. Note that the beam expander 201 is advantageous in the case where the laser beam emitted from the laser oscillator 101 is small; however, it may not necessarily be used in the case where the laser beam is large, and a practitioner may suitably decide whether or not to use it. In this specification, the curvature radius of a lens is positive when the center of the curvature is on a beam emitting side of the lens face, and is negative when the center of the curvature is on a beam incident side of the lens face. In addition, a face of the lens where light enters is the first surface and a face from which light is emitted is the second surface.

The laser beam 107 expanded by the beam expander 201 is reflected by the splitter 102. The splitter 102 splits the laser beam 107 into two of the first laser beam 108 and the second laser beam 109 which have semicircular cross sections and axisymmetric intensity distributions as shown in FIGS. 5C, 5D, 5G, and 5H.

The first laser beam 108 is reflected by the mirror 104, and passes through the half wave plate 203. After the first laser beam 108 passes through the half wave plate 203, it is s-polarized. Further, the first laser beam 108 enters a polarization beam splitter 205.

Meanwhile, the second laser beam 109 split by the splitter 102 is reflected by the mirror 103, and passes through the half wave plate 202. After the second laser beam passes through the half wave plate 202, it is p-polarized. Further, the second laser beam 109 reflected by the mirror 204 enters the polarization beam splitter 205.

An optical path of the second laser beam 109 is longer than an optical path of the first laser beam 108 by a distance d which is the distance between the mirror 204 and the polarization beam splitter 205, and an optical path difference d is provided for the second laser beam 109. Therefore, the second laser beam 109 is applied on the surface to be irradiated 110 delayed for a time corresponding to the optical path difference d from the first laser beam 108. The optical path difference d has a length corresponding to the pulse width of the laser beam 107 or more and less than a length corresponding to the pulse repetition interval. Further, in the case of considering light reflected by the back face of the substrate, an optical path difference calculated from the Equations obtained in Embodiment Mode 2 is provided.

The first laser beam and the second laser beam are applied from the polarization beam splitter 205 in different periods respectively, thereby supplying a uniform thermal energy distribution to the common portion of the surface to be irradiated. The first laser beam projected on the surface to be irradiated 110 by cylindrical lenses 105 and 106. The focal length of the cylindrical lens 105 is 150 mm, and the thickness is 5 mm. Thus, a laser beam can be shaped so that the beam cross section on the surface to be irradiated 110 has a length of 500 μm in a longitudinal direction. Further, the focal length of the cylindrical lens 106 is 20 mm. Thus, a laser beam is shaped so that the beam cross section on the surface to be irradiated 110 has a length of 10 μm in a transverse direction. In the above manner, a linear beam on a surface to be irradiated can be formed.

In this embodiment, a laser beam can be split and applied to the common portion of the semiconductor film in different periods respectively while suppressing interference between laser beams; thus, the thermal energy distribution on a surface to be irradiated can be made uniform. Consequently, uniform crystal growth can be realized. Further, continuous crystal growth can be conducted by irradiation with even split beams, thereby obtaining a large grain crystal.

For example, a YAG laser having a pulse width of 10 ps, a repetition rate of 10 MHz is split and applied to a common portion of silicon in different periods respectively, thereby crystallizing silicon. The set time of silicon is generally 100 ns. In the case where an optical path difference equivalent to the coherence length is provided for the YAG laser to suppress optical interference; normally, a time lag long as 300 ns or more must be provided between the split beams. Therefore, since time lag of the split beams is longer than the set time of silicon, silicon can not be continuously crystallized with the split beams. On the other hand, in the case of providing an optical path difference corresponding to the pulse width or more for the YAG laser, time lag of at least 10 ps or more is caused between the split beams. Since 10 ps is much shorter than the set time of silicon, silicon can be continuously crystallized with the split beams.

Embodiment 2

In Embodiment 2, a laser irradiation apparatus having a different structure from Embodiment 1 will be describe with reference to FIG. 7A. FIG. 7A is a top view of a laser irradiation apparatus, and FIG. 7B is a side view thereof. The same components as FIG. 6 are denoted by the same marks and the description will not be repeated.

A laser beam 107 output from the laser oscillator 101 for emitting a megahertz laser beam is expanded in a longitudinal direction and a transverse direction of the beam cross section by the beam expander 201 including the spherical lenses 201a and 201b.

The laser beam 107 which has passed through the beam expander 201 is split by a cylindrical lens array 701. Here an example of splitting it into two is described; however, a cylindrical lens for splitting it into more than two may also be used. A cylindrical lens included in the cylindrical lens array 701 has a thickness of 5 mm, and the curvature radius of the first surface is 40 mm.

Here, the laser beam split into two are a first laser beam 108 and a second laser beam 109 respectively. Further, only the second laser beam 109 is passed through a retarder 702 arranged behind the cylindrical lens array 701. The retarder 702 may be anything as long as it has a function of delaying the second laser beam 109 from the first laser beam 108. Here, a quartz plate is used as the retarder 702. When the thickness of the quartz plate to be used is $d_1$, velocity of light is c, and the refractive index of the quartz plate is n; the optical path difference between the split laser beams is expressed by $d_1(n-1)/c$, and optical path difference can be selected by controlling the thickness of the quartz plate.

Other than a quartz plate, a medium which does not absorb a megahertz laser beam may be used for the retarder 702. For example, glass (BK7), water, a crystal containing fluoride, or the like can be used. Incidentally, quartz does not absorb a megahertz laser beam either.

The first laser beam and the second laser beam are collected after passing through a cylindrical lens 703. The cylindrical lens 703 has a curvature radius of 70 mm on a first lens surface and a thickness of 5 mm. Thus, the first laser beam and the second laser beam are applied to a common portion of a surface to be irradiated in different periods respectively behind the cylindrical lens 703, and a uniform thermal energy distribution is obtained.

The split beams 108 and 109 are projected on the surface to be irradiated 110 by the cylindrical lenses 105 and 106. The length of the beam cross section in the longitudinal direction is shaped to 500 µm by the cylindrical lens 105. Further, the length of the beam cross section on the surface to be irradiated is shaped by the cylindrical lens 106. The focal length of the cylindrical lens 106 is 20 mm, and the length of the beam cross section on the surface to be irradiated is shaped to 10 µm. A linear beam spot can be formed on the surface to be irradiated by the above optical system.

Note that, in this specification, "linear" does not mean "line", in a strict sense but a rectangular having high aspect ratio (or an oblong). For example, one having an aspect ratio of 2 or more (preferably, 10 to 10000) is called to be linear.

In this embodiment, a method for providing an optical path difference using a refractive index caused by a retarder is explained. Further, in this embodiment, the optical path difference may be provided in combination with a method described in Embodiment 1 in which a refractive index is not used.

In this embodiment, a megahertz laser beam can be split and applied to a common portion of a surface to be irradiated in different periods respectively while suppressing the effect of interference between laser beams by using a megahertz laser beam having an ultrashort pulse. Thus, a uniform thermal energy distribution can be obtained.

Embodiment 3

Figure 8A:
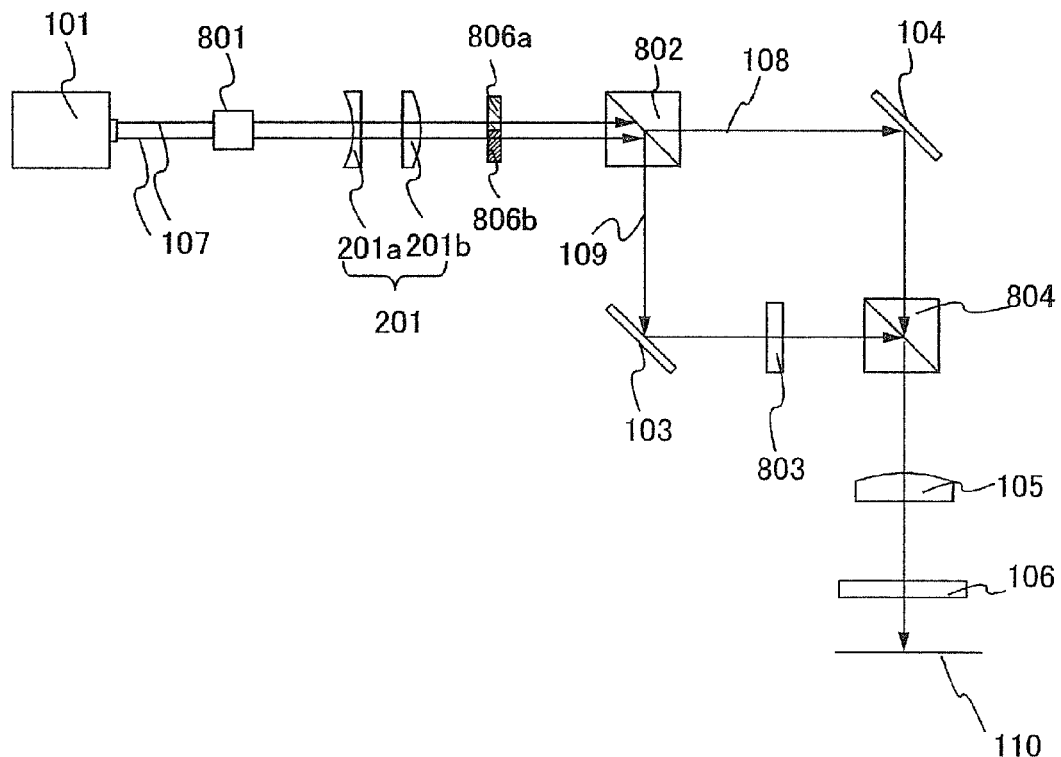
FIGS. 8A to 8I are figures for explaining Embodiment 3.
Figure 8B:
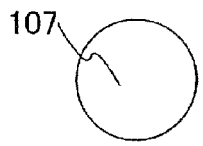
Figure 8C:
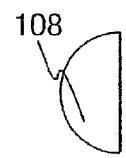
Figure 8D:
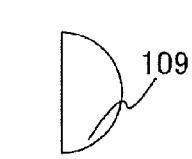
Figure 8E:
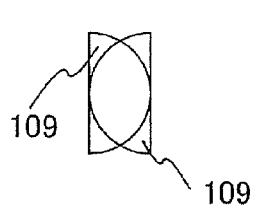
Figure 8F:
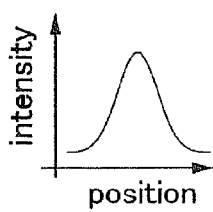
Figure 8G:
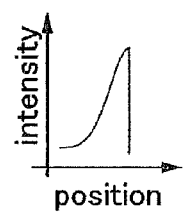
Figure 8H:
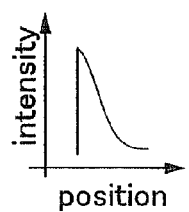
Figure 8I:
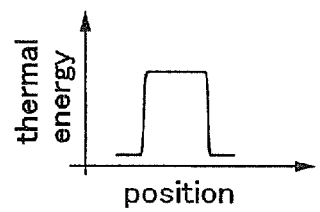

In this embodiment, an example of a laser irradiation apparatus for splitting and a megahertz laser having an ultrashort beam pulse and applying the split beams to a common portion of a surface to be irradiated in different periods respectively will be described with reference to FIGS. 8A to 8I. The same components as FIG. 5A are denoted by the same marks and the description will not be repeated. FIG. 8A shows a laser irradiation apparatus, FIG. 8B shows a beam cross section of a megahertz laser beam before splitting, FIGS. 8C and 8D show beam cross sections of split laser beams, and FIG. 8E shows cross sections of split beams applied to a common portion of a surface to be irradiated in different periods respectively. FIG. 8F shows intensity distribution of a beam cross section before splitting, FIGS. 8G and 8H show intensity distributions of split beam cross sections, and FIG. 8I shows thermal energy distribution of the common portion of the surface to be irradiated with the sprit beams in different periods respectively.

A laser beam 107 output from the laser oscillator 101 is converted into a second harmonic by a nonlinear optical element 801. The laser beam which has passed through the nonlinear optical element 801 is expanded both in a longitudinal direction and a transverse direction by a beam expander 201 including spherical lenses 201a and 201b. Note that the beam expander is not necessarily used depending on the size or the like of a laser beam.

The laser beam 107 expanded by the beam expander passes through one of a first half wave plate 806a and a second half wave plate 806b. When the laser beam 107 passes thorough the first half wave plate 806a a half of the laser beam 107 is polarized in a first polarization direction, and when the laser beam 107 passes through the second half wave plate 806b, a half of the laser beam 107 is polarized in a second polarization direction which is deviated for 90° from the first polarization direction. The first half wave plate 806a and the second half wave plate 806b are provided so that the shapes of the cross sections of the first laser beam 108 and the second laser beam 109 are made semicircular by the polarization beam splitter 802 as shown in FIGS. 8C and 8D, and that the intensity distributions has Gaussian distribution divided axisymmetrically as shown in FIGS. 8G and 8H.

Next, the laser beam 107 is split into the first laser beam 108 and the second laser beam 109 by the polarization beam splitter 802. The first laser beam 108 passes through the polarization beam splitter 802, and reflects off the mirror 104. Further, the first laser beam enters a polarization beam splitter 804.

Meanwhile, the second laser beam is reflected by the polarization beam splitter 802 and reflected by the mirror 103.

Here, a retarder 803 is provided between the mirror 103 and the polarization beam splitter. Here, a quartz plate is used as the retarder 803. Accordingly, an optical path difference is caused between the first laser beam 108 and the second laser beam 109, so that interference the surface to be irradiated between the first laser beam and the second laser beam can be prevented. The optical path difference can be set freely by selecting the thickness of the quartz plate. Further, the first laser beam and the second laser beam are applied to the common portion of the surface to be irradiated in different periods respectively, so that the energy distribution can be made uniform.

The first laser beam 108 and the second laser beam 109 enter the cylindrical lens 105 and the length in the longitudinal direction of the beam cross section is shaped, and enters the cylindrical lens 106, so that the length in a transverse direction of the beam cross section is shaped. Note that, the first laser beam 108 and the second laser beam 109 immediately after split by the polarization beam splitter 802 have intensity distributions on the sections as the intensity distribution of the laser beam 107 is divided axisymmetrically as shown in FIGS. 8G and 8H. The intensity distribution of the laser beam 107 is corrupted as the beams propagate to make the section loose. However, when the position of the polarization beam splitter 802 and the position of the surface to be irradiated 110 are conjugated with respect to cylindrical lens 105 which operates on the longitudinal direction of the beam cross section, thereby solving the problem.

In this embodiment, a method for providing an optical path difference using a refractive index caused by a retarder is explained. Further, in this embodiment, the optical path difference may be provided in combination with a method described in Embodiment 1 in which a refractive index is not used.

In this embodiment, a megahertz laser beam can be split and the split beams are applied to the common portion of the surface to be irradiated in different periods respectively while suppressing the effect of interference between megahertz laser beams by using a megahertz laser beam having an ultrashort pulse. Thus, a uniform thermal energy distribution can be obtained.

Embodiment 4

Figure 9A:
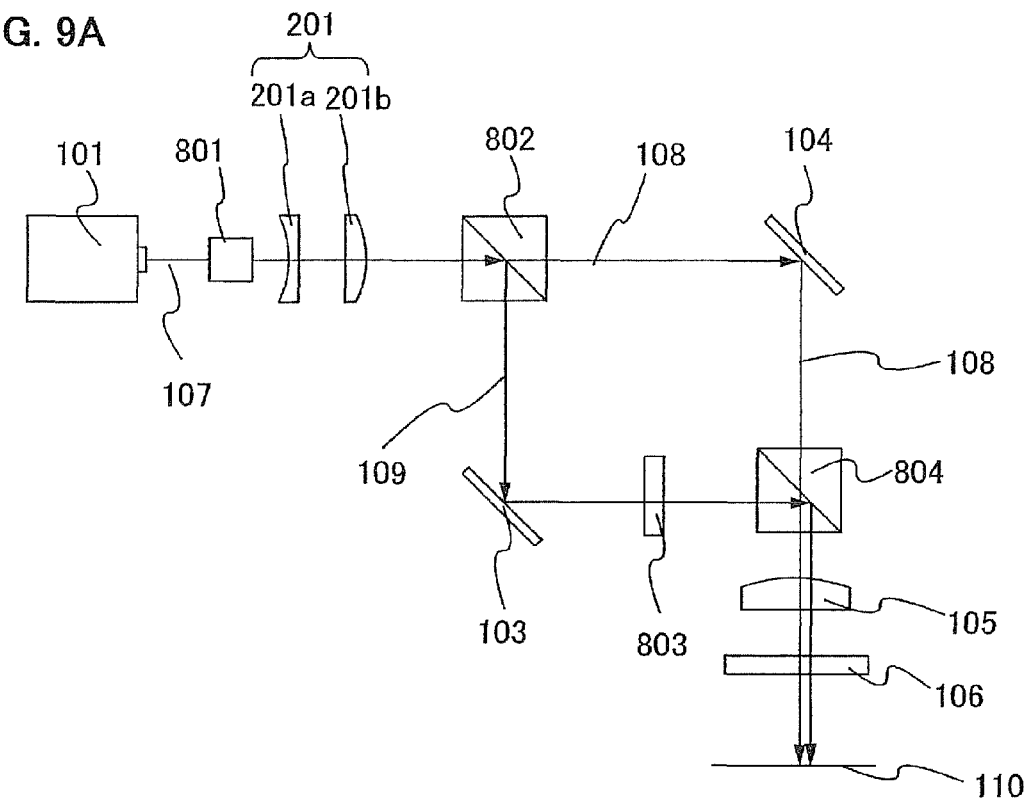
FIGS. 9A to 9G are figures for explaining Embodiment 4.
Figure 9B:
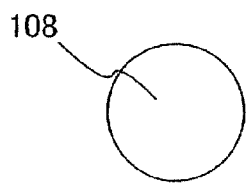
Figure 9C:
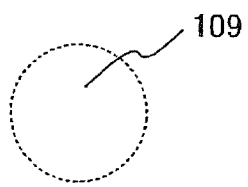
Figure 9D:
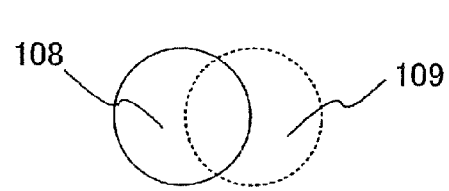
Figure 9E:
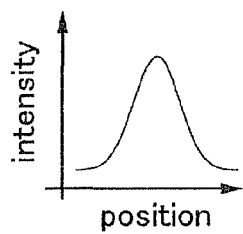
Figure 9F:
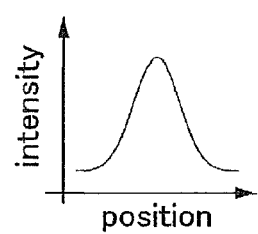

In this embodiment, a method of applying a laser beam different from Embodiment 3 will be explained with reference to FIGS. 9A to 9G. FIG. 9A shows a laser irradiation apparatus, FIGS. 9B and C show the cross section shapes of first and second laser beams, FIG. 9D shows a cross section when applying the first laser beam and the second laser beam to a common portion of a surface to be irradiated in different periods respectively, and FIGS. 9E and 9F show intensity distributions corresponding to FIGS. 9B to 9D respectively and 9G shows a thermal energy distribution of a common portion of a surface to be irradiated with the split beams in different periods respectively.

A laser beam 107 output from the laser oscillator 101 is converted into a second harmonic by a nonlinear optical element 801. The laser beam which has passed through the nonlinear optical element 801 is expanded both in a longitudinal direction and a transverse direction by a beam expander 201 including spherical lenses 201a and 201b. Note that the beam expander is not necessarily used depending on the size or the like of a laser beam.

The laser beam 107 expanded by the beam expander is split into the first laser beam 108 and the second laser beam 109 by the polarization beam splitter 802. The cross sections of the split first laser beam 108 and the second laser beam 109 are circular and the intensity distributions have Gaussian distributions (FIGS. 9B, 9C, 9E, and 9F).

The first laser beam 108 passes through the polarization beam splitter 802, and reflects off the mirror 104. Further, the first laser beam enters a polarization beam splitter 804.

Meanwhile, the second laser beam is reflected by the polarization beam splitter 802 and reflected by the mirror 103. Further, the second laser beam enters the polarization beam splitter 804.

Specifically, the optical path length of the second laser beam 109 between the polarization beam splitter 802 and the polarization beam splitter 804 is set to be longer than the optical path length of the first laser beam 108 between the polarization beam splitter 802 and the polarization beam splitter 804 by 0.5 time or less of the beam diameter. Thus, by applying the first laser beam 108 and the second laser beam 109 to the surface to be irradiated in different periods respectively, the thermal energy distribution can be made uniform. In the case of splitting the laser beam 107 using the polarization beam splitter 802, the intensity distributions of the first laser beam 108 and the second laser beam 109 have Gaussian distributions as shown in FIGS. 9E and 9F. Accordingly, by applying the first and second laser beams to the surface to be irradiated in different periods respectively using the polarization beam splitter 804, the first and second laser beams are applied to completely the same portion; a uniform thermal energy distribution cannot be obtained. However, as in this embodiment, in overlapping the surfaces to be irradiated with the first laser beam 108 and the second laser beam 109, which have some deviation from each other, the thermal energy distribution can be made uniform.

Figure 9G:
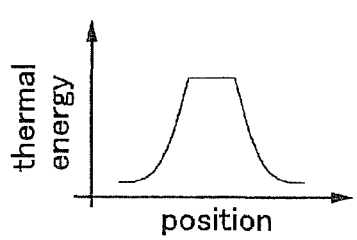

Further, the optical path length of the second laser beam 109 between the polarization beam splitter 802 and the polarization beam splitter 804 may be set to be longer than the optical path length of the first laser beam 108 between the polarization beam splitter 802 and the polarization beam splitter 804 by 0.5 to 0.7 times as the beam diameter. When an optical path difference which is as 0.5 times as the beam diameter or more is provided, the thermal energy distribution at a time of applying the first laser beam and the second laser beam to the common portion of the surface to be irradiated in different periods respectively is not uniform as shown in FIG. 9G However, the area of the beam cross section can be increased, so that an surface can be irradiated more efficiently. Note that when an optical path difference as 0.7 times as the beam diameter or more is provided, the energy density of the beam cross section is weak and part of the surface to be irradiated is not crystallized; thus, the optical path difference is preferably as 0.5 to 0.7 times as long as the beam diameter.

Embodiment 5

In this embodiment, a method for manufacturing a semiconductor device using the present invention will be described.

Figure 10A:
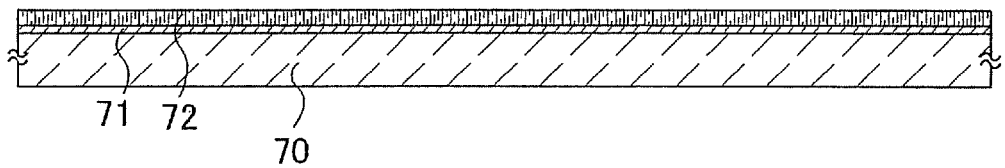
FIGS. 10A to 10D are figures for explaining Embodiment 5.
Figure 10B:
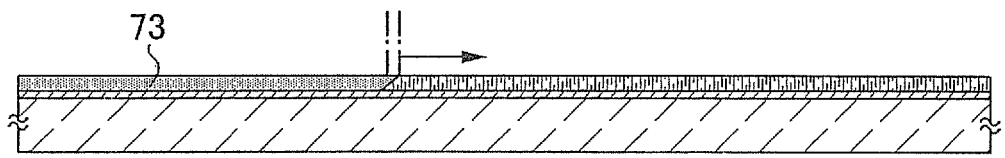

A method for manufacturing a semiconductor device will be explained with reference to FIG. 10. First, as shown in FIG. 10A, a base film 71 and an amorphous semiconductor film 72 are stacked in order over an insulating substrate 70. Then, the amorphous semiconductor film 72 is irradiated with a megahertz laser beam of the present invention (FIG. 10B). By uniformly irradiating the amorphous semiconductor film with the megahertz laser beam, the amorphous semiconductor film can be crystallized uniformly, thereby obtaining a crystalline semiconductor film 73 having large grain crystals. Accordingly, a thin film transistor (TFT) in which little grain boundaries exist in a carrier transfer direction of the channel can be formed using the crystalline semiconductor film 73.

Figure 10C:
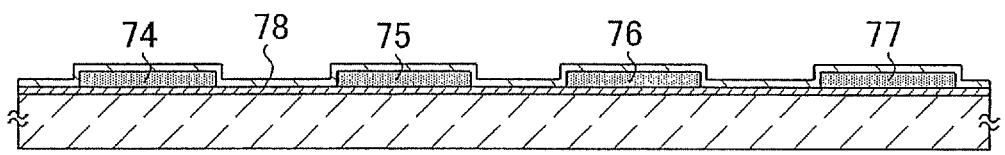

After that, the crystalline semiconductor film 73 is etched as shown in FIG. 10C, thereby forming island-shaped semiconductor films 74 to 77. Next, a gate insulating film 78 is formed so as to cover the island-shaped semiconductor films 74 to 77. The gate insulating film 78 can be formed of, for example, silicon oxide, silicon nitride, or silicon nitride oxide by plasma CVD, sputtering, or the like. For example, an insulating film containing silicon with a thickness of 30 nm to 200 nm may be formed by sputtering.

Figure 10D:
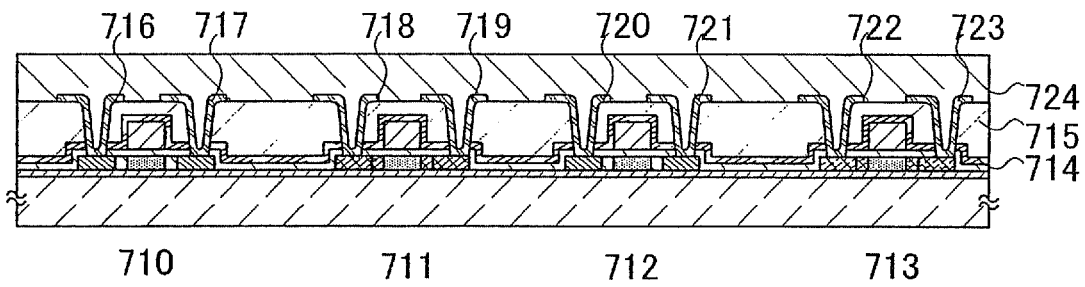

Next, a conductive film is formed over the gate insulating film 78 and etched, thereby forming a gate electrode. After that, impurities imparting n-type or p-type conductivity are selectively added into the island-shaped semiconductor films 74 to 77 using the gate electrode as a mask, thereby forming a source region, a drain region, an LDD region, and the like. Through the above-mentioned steps, N-channel transistors 710 and 712, and P-channel transistors 711 and 713 can be formed over one substrate (FIG. 10D). Subsequently, an insulating film 714 is formed to protect those transistors. This insulating film 714 may be formed in a single-layer structure or a layered structure with an insulating film containing silicon of 100 to 200 nm thick by plasma CVD or sputtering. For example, a silicon oxynitride film of 100 nm thick may be formed by plasma CVD.

An organic insulating film 715 is formed over the insulating film 714. The organic insulating film 715 is formed from an organic insulating film of polyimide, polyamide, BCB, acrylic, or the like applied by an SOG method. The insulating film 715 is preferably formed with a film superior in flatness in the case where the unevenness due to thin film transistors formed over the glass substrate 70 is to be reduced. Moreover, the insulating film 714 and the organic insulating film 715 are patterned by a photolithography method to form a contact hole therein that reaches the impurity region.

Next, a conductive film is formed from a conductive material and patterned, thereby forming wirings 716 to 723. After that, an insulating film 724 is formed as a protective film, thereby completing a semiconductor device shown in FIG. 10D. The method for manufacturing a semiconductor device using a laser annealing method of the present invention is not limited to the structure of the thin film transistors described above. In this embodiment, the crystalline semiconductor film obtained by irradiation with a megahertz laser beam split and applied in different periods respectively is used as an active layer of a TFT. Accordingly, it is possible obtain large grain crystals and the mobility of the semiconductor device can be increased.

A process in which a metal element is added to an amorphous semiconductor film may be provided before crystallization with laser light. As the metal element, nickel (Ni), germanium (Ge), iron (Fe), palladium (Pd), tin (Sn), lead (Pb), cobalt (Co), platinum (Pt), copper (Cu), gold (Au), or the like can be used. When laser irradiation is carried out after the crystallization by adding the metal element, the crystal formed through the crystallization using the metal element is recrystallized as a crystal core. Therefore, the crystallinity of the semiconductor film can be enhanced compared with the crystallization process of only laser irradiation; thus, roughness of the semiconductor film surface after crystallization by laser irradiation can be suppressed. Thus, variations in characteristics of the a semiconductor element typified by TFT which is to be formed later can be reduced and the off-state current can be suppressed.

Noted that after adding a metal element and crystallizing by heat treatment, the crystallinity may be enhanced by laser irradiation; alternatively, the crystallization may be performed after adding the metal element without heat treatment.

Although this embodiment mode has described the example of using the laser irradiation method of the present invention for crystallizing the semiconductor film, the laser irradiation method of the present invention may be applied to activate an impurity element added into the semiconductor film. In this embodiment, in the case of manufacturing a semiconductor device used for a functional circuit such as a driver or a CPU, a thin film transistor having an LDD region or a thin film transistor having a structure in which the LDD region overlaps the gate electrode can be fitly formed. Further, in order to increase the speed of a semiconductor device, it is preferable to make the thin film transistor smaller. Since the n-channel transistors 710 and 712 and the p-channel transistors 711 and 713 has an LDD structure including an LDD region, it is preferably used for a driver or a CPU.

Embodiment 6

Figure 17:
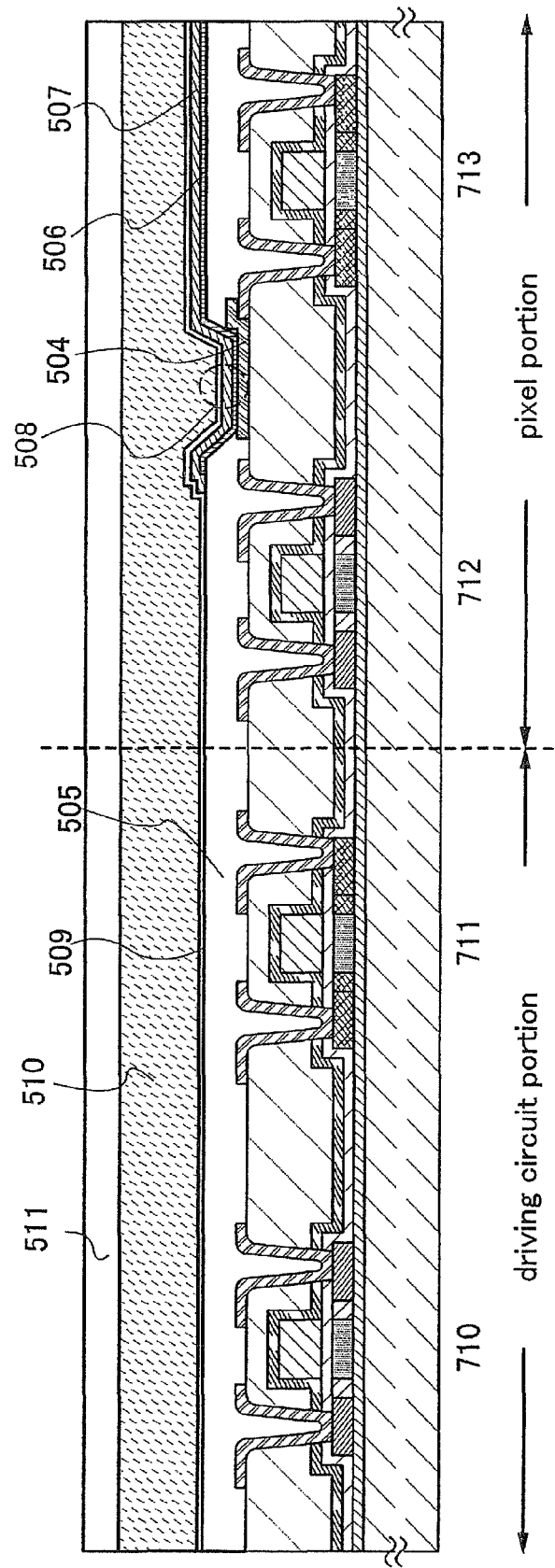
FIG. 17 is a figure for explaining Embodiment 6.

In this embodiment, a method for manufacturing an EL display device using the semiconductor device manufactured in accordance with Embodiment 5 will be described with reference to FIG. 17.

A pixel electrode 504 is formed to be in contact with a wiring 722. The pixel electrode 504 is formed by etching a transparent conductive film. A compound of indium oxide and tin oxide, a compound of indium oxide and zinc oxide, zinc oxide, tin oxide, or indium oxide can be used for the transparent conductive film.

After forming the pixel electrode, a partition wall 505 is formed of a resin material. The partition wall 505 is formed by etching an acrylic film or a polyimide film with a thickness of 1 µm to 2 µm so that a part of the pixel electrode 504 is exposed. Note that a black film to serve as a black shielding film (not shown) may be provided appropriately under the partition wall 505.

Next, an EL layer 506 is formed. When a light emitting material of the EL layer 506 is an organic compound, an organic EL element is obtained. When a light emitting material of the EL layer 506 is an inorganic compound, an inorganic EL element is obtained.

An inorganic EL element is classified into a dispersive inorganic EL element and a thin-film inorganic EL element depending on its element structure. The dispersive inorganic EL element has a light emitting layer in which particles of the light emitting material is dispersed in a binder. The thin-film inorganic EL element has a light emitting layer formed of a thin film of a fluorescent material. In the light emission mechanism of both the elements, light can be obtained by collision excitation of a base material or the light emission center by an electron which is accelerated in a high electric field. When an inorganic EL element is formed, an insulating layer in which a light emitting material is dispersed is preferably provided as an EL layer between the pixel electrode 504 and an electrode 507, or a light emitting layer sandwiched between insulating layers is preferably provided between the pixel electrode 504 and the electrode 507. For example, zinc sulfide (ZnS) or strontium sulfide (SrS) can be used as a light emitting material. An EL layer of an inorganic EL element can be formed by screen printing, vapor deposition, or the like.

An example of using an organic EL element will be described below.

The EL layer 506 and the electrode (MgAg electrode) 507 are formed continuously by vacuum vapor deposition without exposure to the atmosphere. Note that it is desirable to form the EL layer 506 in a thickness of 100 nm to 1 µm and the electrode 507 to a thickness of 180 nm to 300 nm (typically, 200 nm to 250 nm). The EL layer may be formed by an ink-jet method, screen-printing, or the like as well.

In this step, an EL layer and a cathode are sequentially formed in each pixel corresponding to red, green, and blue. However, it is necessary to form the EL layer individually for each color without using a photolithography technique because the EL layer has low resistance to solutions. Therefore, it is preferable to cover pixels other than the predetermined pixels with a metal mask to form an EL layer and a cathode selectively in necessary portions. A triplet compound is used for at least one of each color. Since the triplet compound has higher luminance than a singlet compound, it is preferable that a triplet compound is used to form a pixel corresponding to red which looks dark, and a singlet compound is used to form other pixels.

In other words, a mask for covering all pixels other than the pixels corresponding to red is prepared, and an EL layer for red emission and an electrode are selectively formed with the use of the mask. Next, a mask for covering all pixels other than the pixels corresponding to green is prepared, and an EL layer for green emission and an electrode are selectively formed with the use of the mask. Then, a mask for covering all pixels other than the pixels corresponding to blue is prepared, and an EL layer for blue emission and an electrode are selectively formed with the use of the mask. Note that different masks are used for each color here; however, one mask may be used for all the colors. In addition, it is preferable to keep vacuum until the EL layers and electrodes are formed in all the pixels.

Note that the EL layer 506 may be formed of a known material. It is preferable to use an organic material as a known material in consideration of drive voltage. For example, an EL layer may have a four-layer structure of a hole-injecting layer, a hole-transporting layer, a light emitting layer, and an electron-injecting. A film in which molybdenum oxide and α-NPD are mixed may also be used for the EL layer. Alternatively, a hybrid layer in which an organic material and an inorganic material are combined may also be used for the EL layer. In the case of using an organic material for the EL layer, each of a low molecular weight material, an intermediate molecular weight material, and a high molecular weight material can be used. In addition, this embodiment mode shows an example of using an MgAg electrode as a cathode of the EL element; however, another known material may also be used.

The electrode 507 is completed through the steps up to the formation of a light emitting element 508. Thereafter, a protective film 509 is provided so as to cover the light emitting element 508 completely. The protective layer 509 can be formed to have a single layer or a stack of insulating films such as a carbon film, a silicon nitride film, or a silicon nitride oxide film.

Further, a sealing material 510 is provided to cover the protective film 509, and a cover member 511 is attached thereto. The sealing material 510 is an ultraviolet light curable resin, which is preferably a material containing a hygroscopic substance or an antioxidant substance. Furthermore, in this embodiment mode, a glass substrate, a quartz substrate, or a plastic substrate can be used for the cover member 511. Although not shown, a polarizing plate may be provided between the sealing material 510 and the cover member 511. The polarizing plate is provided; thus, high-contrast display can be provided.

In this manner, an active matrix EL display device having a structure including a p-channel transistor 711 and an n-channel transistor 710 which are included in a driver circuit area, a n-channel transistor 712 for switching included in a pixel area, and a p-channel transistor 713 for current control is completed. In this embodiment mode, a TFT structure having an LDD region which does not overlap a gate electrode is described; however, the TFT is not limited to this structure. The TFT does not necessarily have an LDD region and it may have an LDD region which partially or wholly overlap a gate electrode.

Through the above steps, an EL display device can be manufactured.

Embodiment 7

This embodiment mode will describe a method for manufacturing a thin film integrated circuit or a contactless thin film integrated circuit device (also referred to as a wireless chip, a wireless IC tag, or RFID (Radio Frequency IDentification)), by using a laser irradiation apparatuses shown in one of FIGS. 5A to 9G will be described with reference to FIGS. 11A to 11E.

First, a release layer 1701 is formed over the glass substrate (first substrate) 1700 by sputtering. The release layer 1701 can be formed by sputtering, low-pressure CVD, plasma CVD, or the like. In this embodiment mode, the release layer 1701 is formed of amorphous silicon to a thickness of approximately 50 nm by sputtering. The material of the release layer 1701 is not limited to silicon and a material which can be selectively etched away (such as W or Mo) may be used. The thickness of the release layer 1701 desirably ranges from 50 nm to 60 nm.

Next, the base insulating film 1702 is formed over the release layer 1701. The base insulating film 1702 is formed in order to prevent an alkaline earth metal or an alkali metal such as Na contained in the first substrate from diffusing into the semiconductor film. An alkali metal or an alkaline earth metal causes an adverse effect on semiconductor characteristics if such metal is in the semiconductor film. The base insulating film 1702 also has a function to protect semiconductor elements in a later step of peeling the semiconductor elements. The base insulating film 1702 may have a single layer structure or a layered structure. Therefore, the base insulating film 1702 is formed from an insulating film of silicon oxide, silicon nitride, silicon oxide containing nitrogen (SiON), silicon nitride containing oxygen (SiNO), or the like which can suppress the diffusion of alkali metal and alkaline earth metal into the semiconductor film.

Next, an amorphous semiconductor film 1703 is formed over the base insulating film 1702. The amorphous semiconductor film 1703 is desirably formed without exposing the substrate to the atmosphere after forming the base insulating film 1702. The thickness of the amorphous semiconductor film 1703 is set in the range of 20 nm to 200 nm (desirably 40 nm to 170 nm, more preferably 50 nm to 150 nm).

Figure 11A:
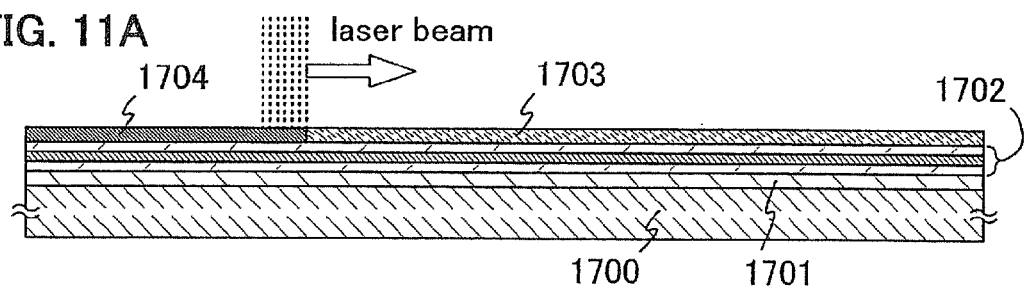
FIGS. 11A to 11E are figures for explaining Embodiment 7.

Then, the substrate is irradiated with a megahertz laser beam using the laser irradiation apparatus shown in FIGS. 5A to 9G, thereby uniformly crystallizing the amorphous semiconductor film 1703. Thus, a crystalline semiconductor film 1704 is formed (FIG. 11A).

Figure 11B:
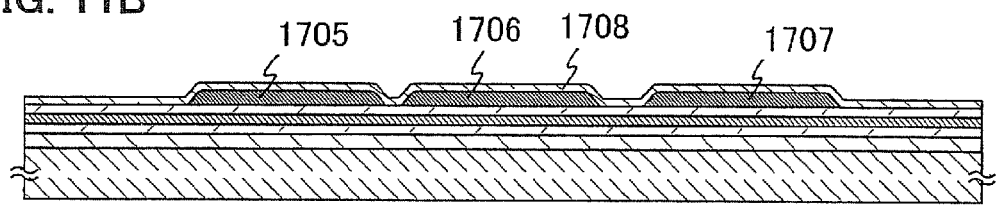

Next, as shown in FIG. 11B, a crystalline semiconductor film 1704 is etched to form island-shaped semiconductor layers 1705 to 1707, and then a gate insulating film 1708 is formed. The gate insulating film 1708 can be formed with silicon nitride, silicon oxide, silicon oxide containing nitrogen, or silicon nitride containing oxygen in a single-layer structure or a layered structure by plasma CVD, sputtering, or the like.

After forming the gate insulating film 1708, heat treatment at 300° C. to 450° C. for 1 to 12 hours may be performed in an atmosphere containing 3% to 100% of hydrogen to hydrogenate the island-shaped semiconductor layers 1705 to 1707. As another means for the hydrogenation, plasma hydrogenation (using hydrogen excited in plasma) may be conducted.

Figure 11C:
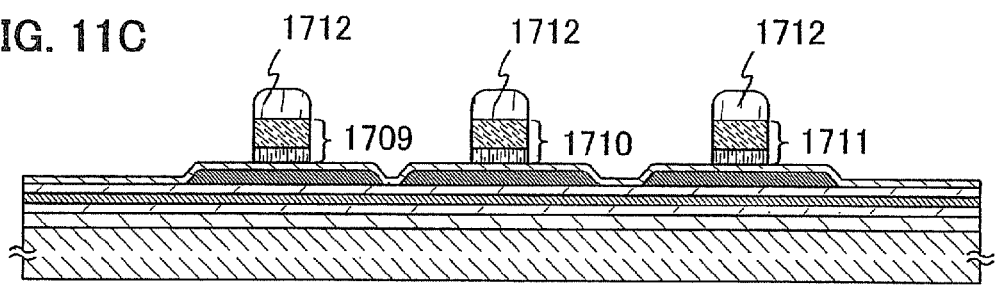

Next, as shown in FIG. 11C, gate electrodes 1709 to 1711 are formed. Here, after forming Si and W into a stack by sputtering, etching is carried out using resist masks 1712 as masks, thereby forming the gate electrodes 1709 to 1711. The conductive material, structure, and manufacturing method of the gate electrodes 1709 to 1711 are not limited to these, and can be selected appropriately. For example, a multilayer structure including NiSi (nickel silicide) and Si doped with impurities imparting n-type conductivity (such as phosphorus or arsenic), or a layered structure including TaN (tantalum nitride) and W (tungsten) may be used. Moreover, a single layer structure using various conductive materials may be employed. In the case of forming the gate electrodes and an antenna at the same time, the material may be selected in consideration of their functions.

A mask of silicon oxide or the like may be used instead of the resist mask. In this case, a step of forming a mask of silicon oxide, silicon oxide containing nitrogen, or the like (this mask is referred to as a hard mask) due to etching is added; however, since the decrease in film thickness of the hard mask by the etching is less than that of a resist mask, the gate electrodes 1709 to 1711 with desired widths can be formed. Moreover, the gate electrodes 1709 to 1711 may be formed selectively by a droplet discharge method without using the resist 1712.

Figure 11D:
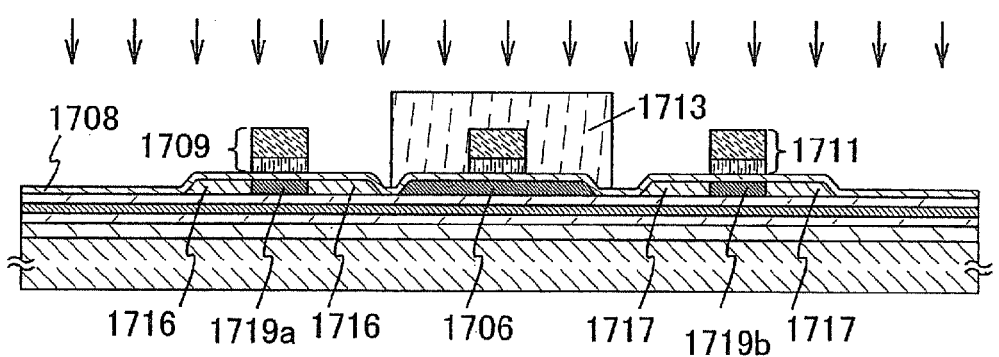

Next, as shown in FIG. 11D, the island-shaped semiconductor layer 1706 to be a p-channel TFT is covered with a resist 1713, and the island-shaped semiconductor layers 1705 and 1707 are doped with an impurity element imparting n-type conductivity (typified by P (phosphorus) or As (arsenic)) using the gate electrodes 1709 and 1711 as masks. In the doping process, doping is conducted through the gate insulating film 1708 and a pair of low-concentration impurity regions 1716 and a channel region 1719*a* are formed in the island-shaped semiconductor layers 1705; meanwhile, a pair of low-concentration impurity regions 1717 and a channel region 1719*b* are formed in the island-shaped semiconductor film 1707. This doping process may be conducted without covering the island-shaped semiconductor layer 1706 to be a p-channel TFT with the resist mask 1713.

Figure 11E:
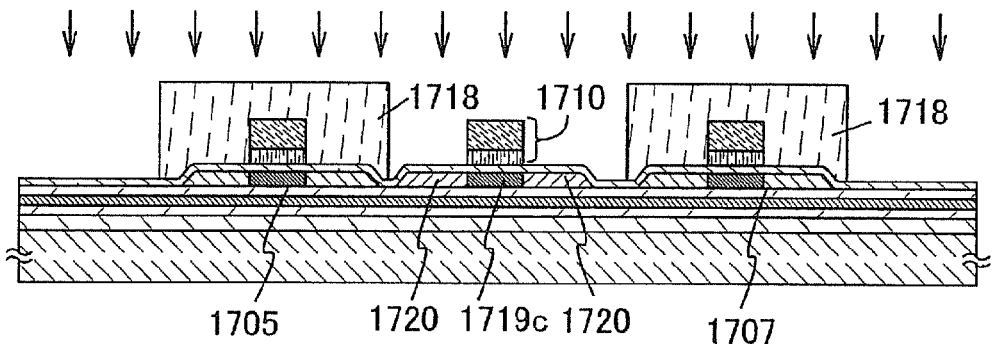

Next, as shown in FIG. 11E, after removing the resist mask 1713 by ashing or the like, resists 1718 are newly formed so as to cover the island-shaped semiconductor layers 1705 and 1717 to be n-channel TFTs. By using the gate electrode 1710 as a mask, the island-shaped semiconductor layer 1706 is doped with an impurity element imparting p-type conductivity (typified by B (boron)). In the doping process, doping is conducted through the gate insulating film 1708, thereby forming a pair of p-type high-concentration impurity regions 1720 and a channel region 1917*c* in the island-shaped semiconductor film 1706.

Figure 12A:
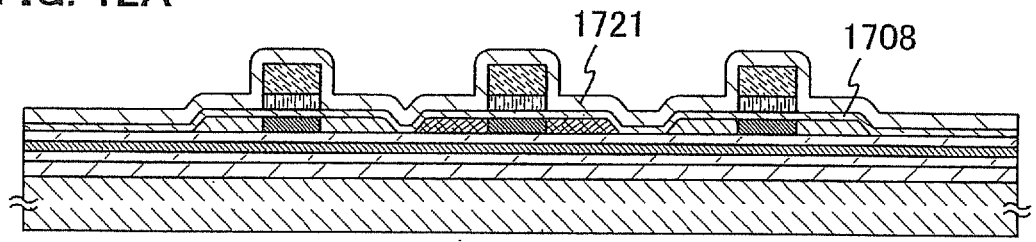
FIGS. 12A to 12D are figures for explaining Embodiment 7.

Subsequently, as shown in FIG. 12A, after removing the resists 1718 by ashing or the like, an insulating film 1721 is formed so as to cover the gate insulating film 1708 and the gate electrodes 1709 to 1711.

Figure 12B:
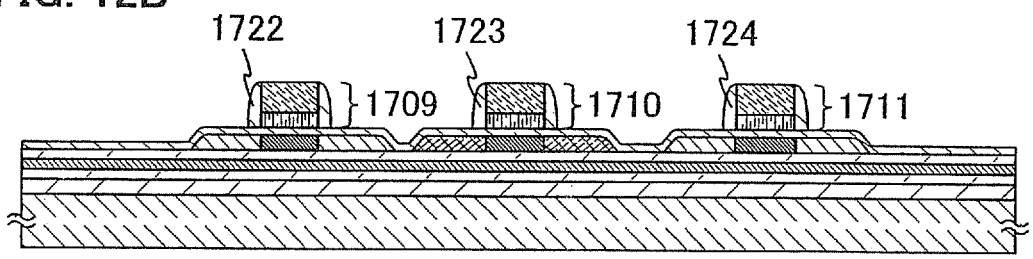

After that, the insulating film 1721 is partially etched by an etch-back method, thereby forming sidewalls 1722 to 1724 that are in contact with both side walls of the gate electrodes 1709 to 1712 in a self-aligned manner as shown in FIG. 12B. As the etching gas, a gas mixture of CHF$_3$ and He is used.

Figure 12C:
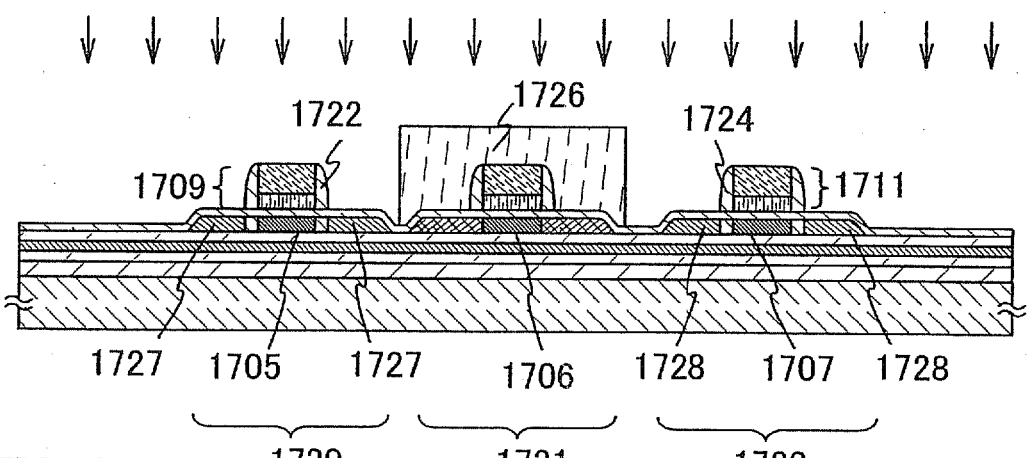

Next, as shown in FIG. 12C, a resist 1726 is newly formed so as to cover the island-shaped semiconductor layer 1706 to be a p-channel TFT. By using the gate electrodes 1709 and 1711 and the sidewalls 1722 and 1724 as masks, an impurity element imparting n-type conductivity (typically P or As) is added. In the doping process, doping is conducted through the gate insulating film 1708, thereby forming a pair of n-type high-concentration impurity regions 1727 and 1728 in the island-shaped semiconductor layers 1705 and 1707.

Next, after removing the resist mask 1726 by ashing or the like, the impurity regions may be thermally activated. At this time, for example, after forming a 50 nm thick silicon oxide film containing nitrogen, heat treatment may be conducted under a nitrogen atmosphere at 550° C. for four hours. Moreover, after forming a 100 nm thick silicon nitride film containing hydrogen, heat treatment may be conducted under a nitrogen atmosphere at 410° C. for one hour to decrease the defects in the polycrystalline semiconductor film. Through such heat treatments, defect in a polycrystalline semiconductor film can be reduced. This is, for example, to terminate dangling bonds in the polycrystalline semiconductor film and referred to as a hydrogenation treatment process or the like.

Through the above steps, an n-channel TFT 1730, a p-channel TFT 1731, and an n-channel TFT 1732 are formed. In the above manufacturing process, fine TFTs each having an LDD length of 0.2 μm to 2 μm can be formed by fitly changing the condition of the etch-back method to adjust the size of the sidewalls. Moreover, after that, a passivation film for protecting the TFTs 1730 to 1732 may be formed.

Figure 12D:
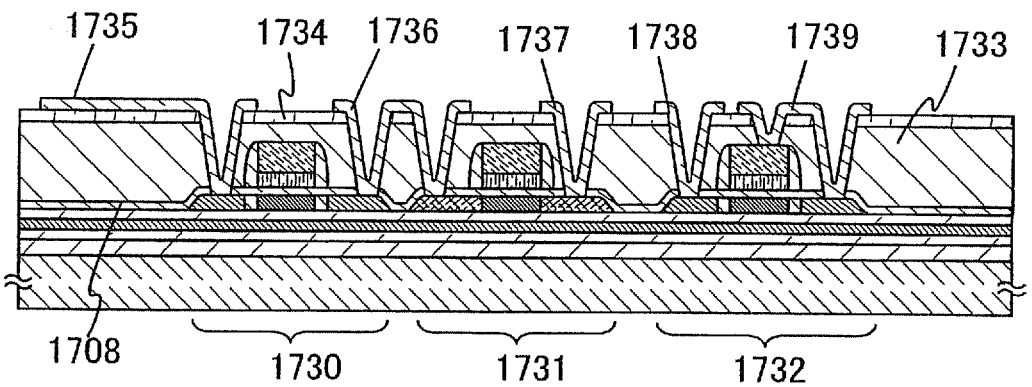

Subsequently, as shown in FIG. 12D, a first interlayer insulating film 1733 is formed so as to cover the TFTs 1730 to 1732. Moreover, a second interlayer insulating film 1734 is formed over the first interlayer insulating film 1733. A filler may be mixed into the first interlayer insulating film 1733 or the second interlayer insulating film 1734. Thus, the first interlayer insulating film 1733 or the second interlayer insulating film 1734 can be prevented from being peeled or cracked due to stress caused by difference in coefficient of thermal expansion between the first interlayer insulating film 1733 or the second interlayer insulating film 1734 and a conductive material and the like for forming a wiring later.

Next, as shown in FIG. 12D, contact holes are formed in the first interlayer insulating film 1733, the second interlayer insulating film 1734, and the gate insulating film 1708, and then wirings 1735 to 1739 to be connected to the TFTs 1730 to 1732 are formed. The wirings 1735 and 1736 are connected to the high-concentration impurity regions 1727 of the n-channel TFT 1730, the wirings 1736 and 1737 are connected to the high-concentration impurity regions 1720 of the p-channel TFT 1731, and the wirings 1738 and 1739 are connected to the high-concentration impurity regions 1728 of the n-channel TFT 1732, respectively. The wiring 1739 is also connected to the gate electrode 1711 of the n-channel TFT 1732. The n-channel TFT 1732 can be used as a memory element of a random ROM.

Figure 13A:
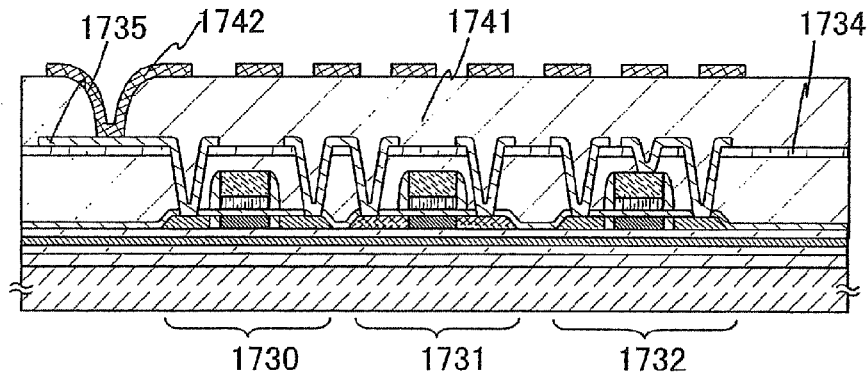
FIGS. 13A to 13D are figures for explaining Embodiment 7.

Next, as shown in FIG. 13A, a third interlayer insulating film 1741 is formed over the second interlayer insulating film 1734 so as to cover the wirings 1735 to 1739. The third interlayer insulating film 1741 is formed so that the wiring 1735 is partially exposed. The third interlayer insulating film 1741 can be formed of the same material as the first interlayer insulating film 1733.

Figure 13B:
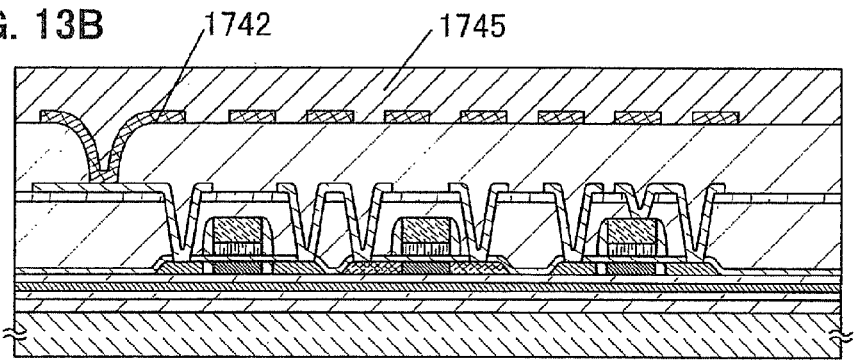
Figure 13C:
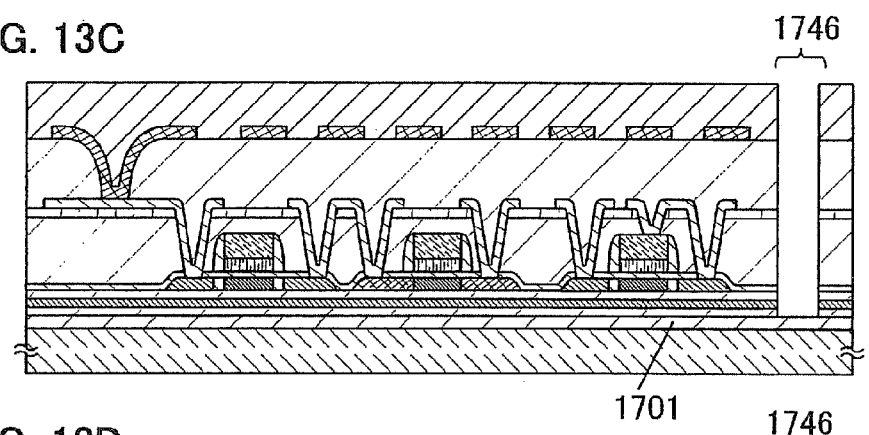

Next, an antenna 1742 is formed over the third interlayer insulating film 1741. The antenna 1742 is formed of a conductive metal of Ag, Au, Cu, Pd, Cr, Mo, Ti, Ta, W, Al, Fe, Co, Zn, Sn, Ni, or the like, or a metal compound thereof. The antenna 1742 is connected to the wiring 1735. In FIG. 13B, the antenna 1742 is directly connected to the wiring 1735; however, the wireless IC tag of the present invention is not limited to this structure. For example, using a separately-formed wiring, the antenna 1742 may be electrically connected to the wiring 1735.

The antenna 1742 can be formed by a photolithography method, an evaporation method, a droplet discharge method, or the like. In FIG. 13A, the antenna 1742 is formed from a single conductive film; however, the antenna 1742 can be formed by stacking a plurality of conductive films. For example, the antenna 1742 may be formed by coating a Ni wiring or the like coated with Cu by electroless plating. The droplet discharge method is a method in which a predetermined pattern is formed by discharging a droplet containing a predetermined composition from a pore, and includes an ink-jet method and the like in its category. The printing method includes screen printing, off-set printing, and the like. By using a printing method or a droplet discharge method, the antenna 1742 can be formed without using a mask for light exposure. Moreover, a droplet discharge method and a printing method does not waste materials which are to be etched away in a photolithography method. Further, since an expensive mask for light-exposure is not necessary, the cost spent on the manufacturing of wireless IC tags can be suppressed.

In the case of using a droplet discharge method or various printing methods, for example, a conductive particle of Cu coated with Ag or the like can also be used. If the antenna 1742 is formed by a droplet discharge method, it is desirable to perform a treatment for increasing the adhesiveness of the surface of the third interlayer insulating film 1741 with the antenna 1742. As a method for increasing the adhesiveness, specifically, a method in which a metal or a metal compound which increases the adhesiveness of a conductive film or an insulating film by a catalytic action is attached to the surface of the third interlayer insulating film 1741, a method in which an organic insulating film, a metal, or a metal compound which has high adhesiveness with a conductive film or an insulating film to be formed is attached to the surface of the third interlayer insulating film 1741, a method in which surface modification is carried out through a plasma treatment on the surface of the third interlayer insulating film 1741 under atmospheric pressure or reduced pressure.

If the metal or the metal compound to be attached to the third interlayer insulating film 1741 has electric conductivity, sheet resistance thereof is controlled so that normal operation of the antenna is not interrupted. Specifically, an average thickness of the metal or the metal compound having electric conductivity may be controlled so as to range from, for example, 1 nm to 10 nm, or the metal or the metal compound may be insulated wholly or partially by oxidation. Alternatively, the attached metal or metal compound may be selectively etched away except for a region where the adhesiveness is to be increased. Moreover, the metal or the metal compound may be selectively attached only to a particular region by a droplet discharge method, a printing method, a sol-gel method, or the like instead of attaching the metal or the metal compound in advance to the whole surface of the substrate. The metal or the metal compound does not necessarily have a completely continuous film shape, and may be dispersed in a measure.

Then, as shown in FIG. 13B, after forming the antenna 1742, a protective layer 1745 is formed over the third interlayer insulating film 1741 so as to cover the antenna 1742. The protective layer 1745 is formed of a material which can protect the antenna 1742 when the release layer 1701 is etched away later. For example, the protective layer 1745 can be formed by applying a resin of an epoxy type, an acrylate type, a silicon type, or the like which can be dissolved in water or alcohols.

Subsequently, as shown in FIG. 13B, a groove 1746 is formed so as to separate the respective wireless IC tags. The groove 1746 has such a depth that the release layer 1701 is exposed. The groove 1746 can be formed by dicing, scribing, or the like. If it is not necessary to separate the wireless IC tags formed over the first substrate 1700, the groove 1746 is not necessarily formed.

Figure 13D:
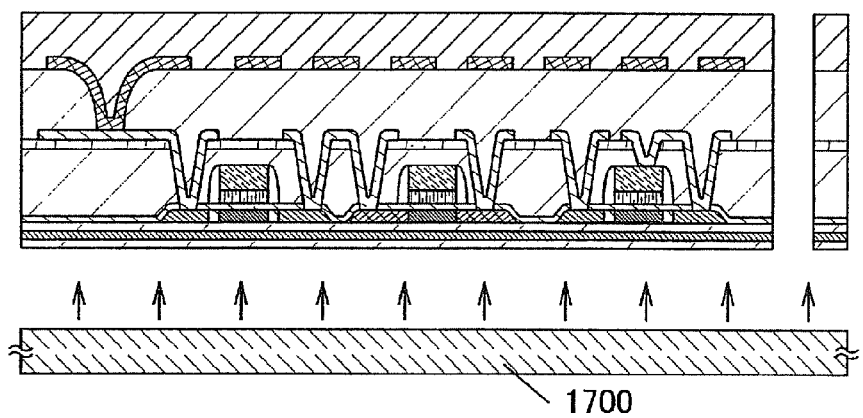

Next, as shown in FIG. 13D, the release layer 1701 is etched away. Here, halogen fluoride is used as the etching gas, and this gas is introduced from the groove 1746. For example, $ClF_3$ (chlorine trifluoride) is used, and the etching is carried out at 350° C. with a flow rate of 300 sccm under a pressure of 798 Pa for three hours. Nitrogen may be mixed into the $ClF_3$ gas. By using halogen fluoride gas such as $ClF_3$, the release layer 1701 can be selectively etched, thereby peeling the first substrate 1700 from the TFTs 1730 to 1732. The halogen fluoride may be either gas or liquid.

Further, the first substrate 1700 may be peeled by heat treatment without using an etchant. For example, a tungsten (W) film is used as the release layer 1701 and is subjected to heat treatment, thereby forming a tungsten oxide ($WO_x$) film on the tungsten film. Accordingly, the tungsten oxide film is formed, so that a part between the release layer and the base insulating layer 1702 becomes brittle; thus, the glass substrate can be peeled readily.

Figure 14A:
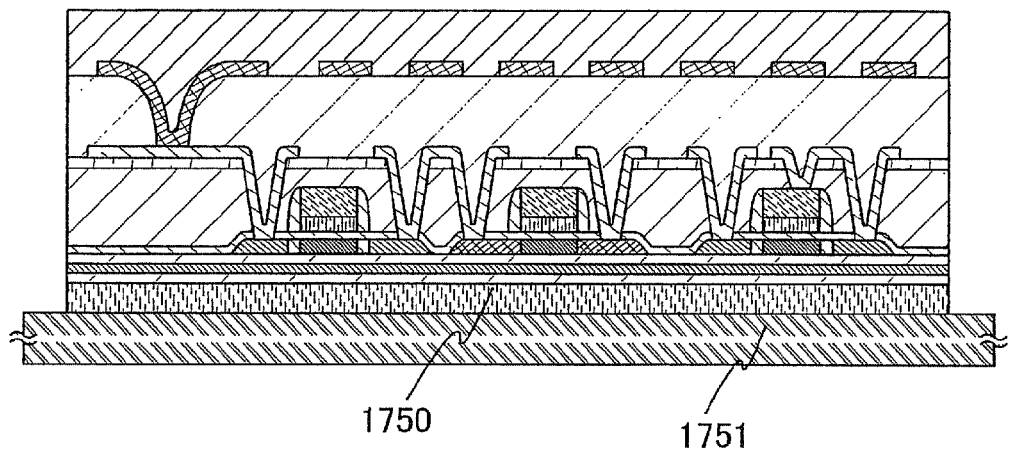
FIGS. 14A and 14B are figures for explaining Embodiment 7.

Subsequently, as shown in FIG. 14A, the peeled TFTs 1730 to 1732 and the antenna 1742 are attached to a second substrate 1751 using an adhesive 1750. The adhesive 1750 is formed with a material which can attach the second substrate 1751 with the base insulating film 1702. As the adhesive 1750, various curing adhesives for example, a reactive curing adhesive, a thermosetting adhesive, a photocuring adhesive such as a UV curable adhesive, an anaerobic adhesive, or the like can be used.

The second substrate 1751 can be formed of a flexible organic material such as paper or plastic.

Figure 14B:
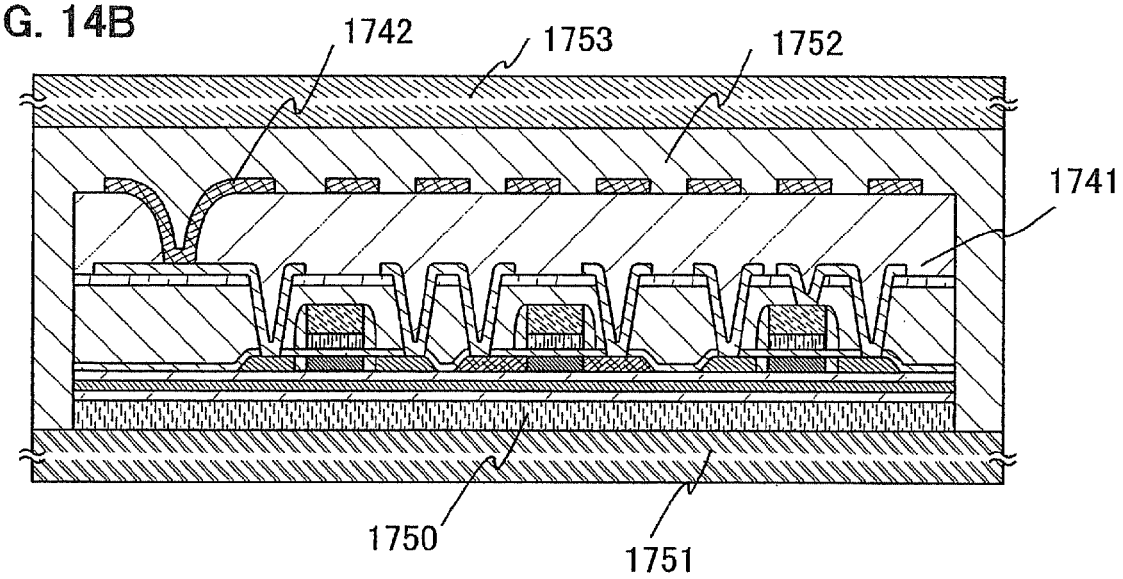

Next, as shown in FIG. 14B, after removing the protective layer 1745, an adhesive 1752 is applied onto the third interlayer insulating film 1741 so as to cover the antenna 1742, and a cover material 1753 is attached. The cover material 1753 can be formed of a flexible organic material such as paper or plastic similarly to the second substrate 1751. The thickness of the adhesive 1752 may range from, for example, 10 μm to 200 μm.

The adhesive 1752 is formed of a material which can attach the cover material 1753 with the third interlayer insulating film 1741 and the antenna 1742. As the adhesive 1752, various curing adhesives for example, a reactive curing adhesive, a thermosetting adhesive, a photocuring adhesive such as a UV curable adhesive, an anaerobic adhesive, or the like can be used.

Through the above steps, the wireless IC tag is completed. In accordance with the above manufacturing method, an extremely thin integrated circuit with a thickness of 0.3 μm to 3 μm, typically about 2 μm, can be formed between the second substrate 1751 and the cover material 1753.

The thickness of the integrated circuit includes not only the thickness of the semiconductor element itself but also the thicknesses of various insulating films and interlayer insulating films formed between the adhesive 1750 and the adhesive 1752. Moreover, the area of the integrated circuit in the wireless IC tag can be made 5 mm square or less (25 $\mu m^2$ or less), more desirably about 0.3 mm square (0.09 $\mu m^2$) to 4 mm square (16 $\mu m^2$).

Although this embodiment mode has shown the method for separating the substrate and the integrated circuit by etching away the release layer provided between the integrated circuit and the first substrate 1700 having high heat resistance, the method for manufacturing a wireless IC tag of the present invention is not limited to the structure. For example, a metal oxide film may be provided between the integrated circuit and the substrate having high heat resistance and this metal oxide film may be weakened by crystallization, so that the integrated circuit is peeled. Alternatively, a release layer using an amorphous semiconductor film containing hydrogen is provided between the integrated circuit and the substrate having high heat resistance and this release layer is removed by irradiation with a laser beam, so that the substrate and the integrated circuit are separated from each other. Alternatively, the highly heat resistant substrate provided with the integrated circuit may be eliminated mechanically or etched away with the use of solution or gas, thereby separating the integrated circuit from the substrate.

Although this embodiment mode has shown the example of forming the antenna and the integrated circuit over one substrate, the present invention is not limited to this structure. The antenna and the integrated circuit may be formed over different substrates and may be electrically connected by being attached to each other later.

Generally, an electric wave frequency of 13.56 MHz, 433 MHz, 860 MHz to 960 MHz, or 2.45 GHz is used for RFID (Radio Frequency IDentification). It is very important to form wireless IC tags so as to detect electric waves with these frequencies for increasing versatility.

The wireless IC tag of this embodiment mode has advantages that an electric wave is hardly blocked as compared with an RFID tag formed from a semiconductor substrate and attenuation of signals due to the block of the electric wave can be prevented. Accordingly, since semiconductor substrates are not necessary, the manufacturing cost of the wireless IC tag can be substantially decreased.

Although this embodiment mode has shown the example of peeling the integrated circuit and attaching the integrated circuit to the flexible substrate, the present invention is not limited to this structure. For example, in the case of using a substrate having high temperature which can withstand the heat treatment in the manufacturing process of the integrated circuit, such as a glass substrate, the integrated circuit is not necessarily be peeled.

Embodiment 8

In this embodiment, a specific example of using a semiconductor device manufactured in accordance with the present invention.

Figure 15A:
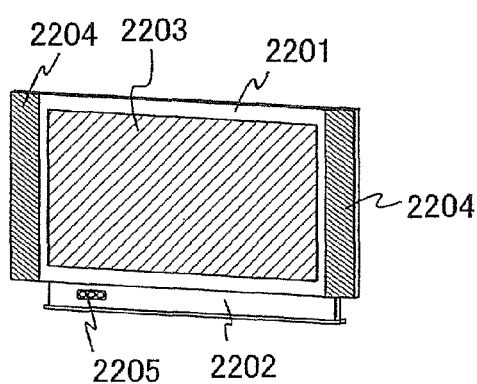
FIGS. 15A to 15F are figures for explaining Embodiment 8.

FIG. 15A shows a display device including a case 2201, a support 2202, a display area 2203, a speaker portion 2204, a video input terminal 2205, and the like. Pixels in the display area 2203 include thin film transistors and the EL display device explained in Embodiment 6 may be used for the display area 2203. By manufacturing the thin film transistors included in the display area 2203 using the invention, bright display with little defect can be achieved. Further, the display area 2203 may have a memory, a driver circuit area, and the like, and the semiconductor device of the present invention may be applied to the memory, the driver circuit area, and the like. The display area includes various display devices in which thin film transistors and various display media are combined, such as a liquid crystal display device using an electro-optic effect of a liquid crystal, a display device using a luminescent material of electroluminescence or the like, a display device using an electron source element, or a display device using a contrast medium whose reflectivity varies in accordance with the application of an electric field (also referred to as electronic ink). The display device can be used for all kinds of information display devices, such as computers, televisions, information display devices such as electronic books, an advertisement display, or a guidance display.

Figure 15B:
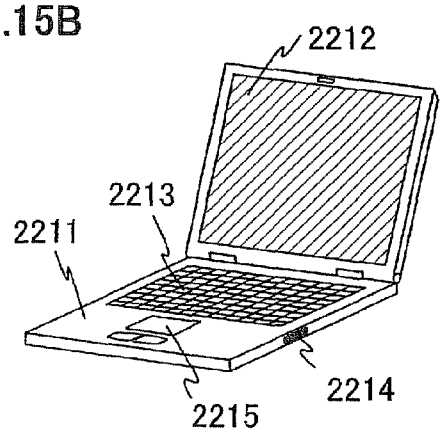
Figure 15C:
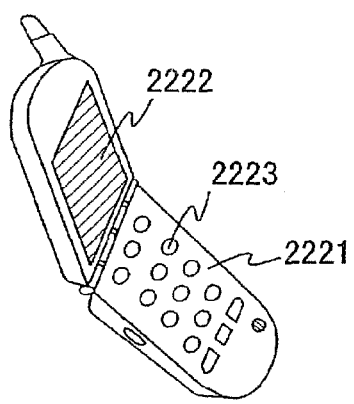

FIG. 15B shows a computer including a case 2211, a display area 2212, a keyboard 2213, an external connection port 2214, a pointing mouse 2215, and the like. Thin film transistors are used in the display area 2212 and a CPU, a memory, a driver circuit area, and the like which are provided on the computer. By applying the semiconductor device in accordance with the present invention to the display area 2212 and the CPU, the memory, the driver circuit area, and the like which are provided on the computer, the product performance can be improved and the drive capacity can be increased.

FIG. 15B shows a mobile phone as a typical example of mobile terminals. This mobile phone includes a case 2221, a display area 2222, an operation key 2223, and the like. Thin film transistors are used in the display area 2222 and a CPU, a memory, a driver circuit area, and the like which can be provided on the mobile phone. By applying the semiconductor device in accordance with the present invention to the display area 2222 and the CPU, the memory, the driver circuit area, and the like attached to the mobile phone, the product quality can be improved and the variation in the quality can be decreased. The semiconductor devices manufactured in accordance with the present invention can be used in electronic devices such as a PDA (Personal Digital Assistant), a digital camera, and a compact game machine, in addition to the mobile phone.

Figure 15D:
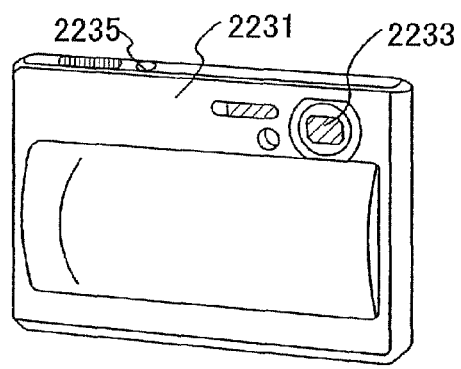
Figure 15E:
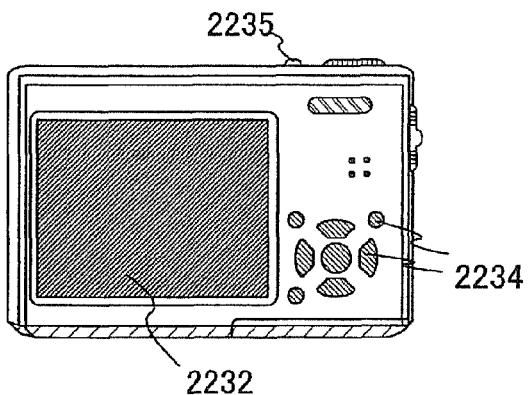

FIGS. 15D and 15E show a digital camera. FIG. 15E shows a rear side of the digital camera shown in FIG. 15D. This digital camera includes a case 2231, a display area 2232, a lens 2233, operation keys 2234, a shutter 2235, and the like. Thin film transistors are used in the display area 2232, a driver circuit area for controlling the display area 2232, and the like. By applying the semiconductor device manufactured in accordance with the present invention to the display area 2232, the driver circuit area for controlling the display area 2232, and other circuits, the product performance can be improved and the drive capacity can be increased.

Figure 15F:
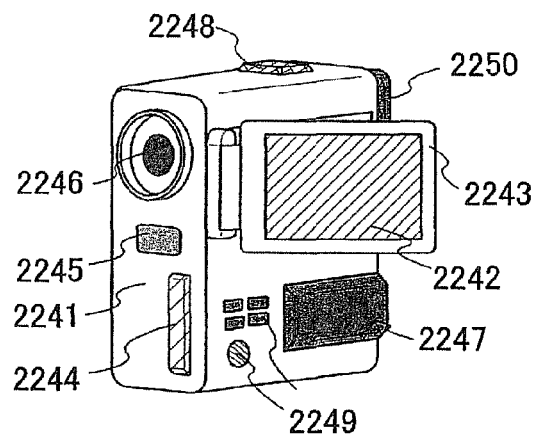

FIG. 15F shows a digital video camera including a main body 2241, a display area 2242, a case 2243, an external connection port 2244, a remote control receiving portion 2245, an image receiving portion 2246, a battery 2247, an audio input portion 2248, operation keys 2249, an eyepiece portion 2250, and the like. Thin film transistors are used in the display area 2242 and a driver circuit area for controlling the display area 2242. By applying the thin film transistors manufactured bin accordance with the present invention to the display area 2242, the driver circuit area for controlling the display area 2242, and other circuits, the product performance can be improved and the drive capacity can be increased.

Moreover, the thin film transistors manufactured in accordance with the present invention can be used for a thin film integrated circuit or a contactless thin film integrated circuit device (also referred to as a wireless IC tag or an RFID (Radio Frequency IDentification) tag). A thin film integrated circuit and a contactless thin film integrated circuit manufactured by using the manufacturing method shown in another embodiment mode can be used for a tag or a memory.

Figure 16A:
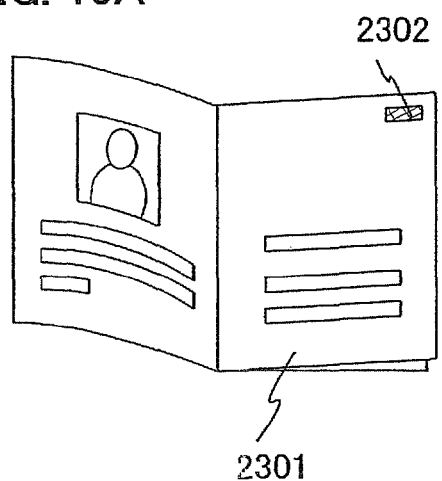
FIGS. 16A and 16B are figures for explaining Embodiment 8.

FIG. 16A shows a passport 2301 with a wireless IC tag 2302 attached thereto. Alternatively, the wireless IC tag 2302 may be embedded in the passport 2301. Similarly, the wireless IC tag can be attached to or embedded in a driver's license, a credit card, a banknote, a coin, a certificate, a merchandise coupon, a ticket, a traveler's check (T/C), a health insurance card, a resident card, a family register, and the like. In this case, only the information showing the authenticity is input in the wireless IC tag and an access authority is set so that the information cannot be read and written improperly. By using the tag in this way, it is possible to distinguish the forged one and the real one.

Figure 16B:
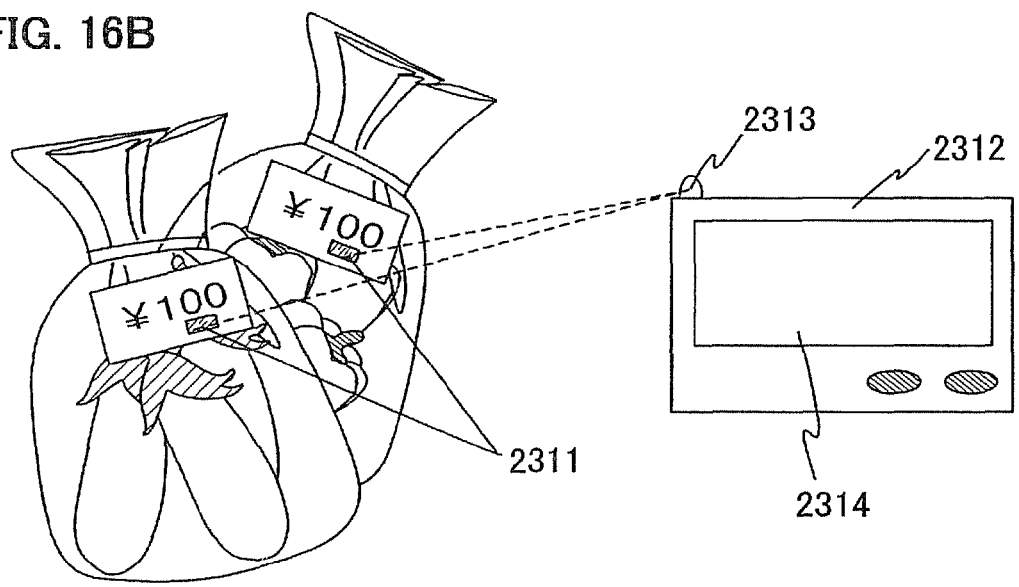

Besides, the wireless IC tag can be used as a memory. FIG. 16B shows an example of embedding a wireless IC tag 2311 in a label to be pasted to a package of vegetables. Alternatively, the wireless IC tag may be attached directly to the package or embedded in the package. In the wireless IC tag 2311, a production area, a producer, a date of manufacture, and a process at a production stage such as a process method, a distribution process of the product, a price, quantity, an intended purpose, a shape, weight, an expiration date, each kind of authentication information, and the like can be recorded. Information from the wireless IC tag 2311 is received by an antenna portion 2313 of a wireless reader 2312 and read, and displayed in a display area 2314 of the reader 2312. Thus, wholesalers, retailers, and consumers can obtain the information easily. Moreover, access authority can be set for each of producers, traders, and consumers. Those who do not have the access authority cannot read, write, rewrite, and erase the data in the wireless IC tag.

The wireless IC tag can be used in the following manner. At the payment, information that the payment has been made is written in the wireless IC tag, and the wireless IC tag is checked by a checker provided at an exit whether or not the information that the payment has been made is written in the wireless IC tag. If the IC tag is brought out from the store without finishing the payment, an alarm rings. With this method, forgetting of the payment and shoplifting can be prevented.

In consideration of protecting customers' privacy, the following method is also possible. At the payment at a cash register, any one of the followings is conducted; (1) data input in the wireless IC tag are locked with pin numbers or the like, (2) data themselves input in the wireless IC tag are encrypted, (3) data input in the wireless IC tag are erased, and (4) data input in the wireless IC tag are destroyed. Then, a checker is provided at an exit, and whether any one of (1) to (4) has been conducted or whether the data in the wireless IC tag are not processed is checked so that whether the payment has been made or not is checked. In this way, whether the payment has been made or not can be checked in the store, and reading out the information in the wireless IC tag against the owner's will outside the store can be prevented.

Several methods for destroying the data input in the wireless IC tag (4) can be given. For example, (a) only data are destroyed by writing one or both of "0 (off)" and "1 (on)" in at least a part of electronic data in the wireless IC tag, or (b) current is excessively supplied to the wireless IC tag to physically destroy a part of a wiring in a semiconductor element included in the wireless IC tag.

Since the manufacturing cost of those wireless IC tags mentioned above is higher than that of conventionally used barcodes, the cost reduction is necessary. According to the present invention, however, since uniform laser annealing of a semiconductor film is possible, semiconductor devices with favorable product quality without variation can be manufactured efficiently, which is effective in the cost reduction. Furthermore, the wireless IC tags can be manufactured so that all of the wireless IC tags have high product quality without variation of performance.

As thus described, the semiconductor device manufactured by the present invention can be applied in a wide range, and the semiconductor device manufactured by the present invention can be applied to electronic devices in all fields.

What is claimed is:

1. A method for manufacturing a semiconductor device, comprising the steps of:
    splitting a laser beam having a pulse width of 100 fs to 1 ns at a repetition rate of 10 MHz or more into at least a first split beam and a second split beam;
    providing an optical path difference between the first split beam and the second split beam, the optical path difference having a length greater than or equal to the pulse width or more and less than a coherence length; and
    crystallizing a semiconductor film by melting a portion of the semiconductor film with the first split beam during a first period and irradiating the second split beam to the melted portion during a second period,
    wherein the second period starts after an end of the first period.

2. A method for manufacturing a semiconductor device according to claim 1, wherein the crystallized semiconductor film is used as a channel of a thin film transistor.

3. A method for manufacturing a semiconductor device according to claim 2, wherein the thin film transistor is applied to an electronic device selected from the group consisting of a display device, a computer, a mobile phone, a digital camera, a digital video camera, a thin film integrated circuit, and a contactless thin film integrated circuit device.

4. A method for manufacturing a semiconductor device, comprising the steps of:
    splitting a laser beam having a pulse width of 100 fs to 1 ns at a repetition rate of 10 MHz or more into at least a first split beam and a second split beam;
    providing an optical path difference between the first split beam and the second split beam, the optical path difference having a length greater than or equal to the pulse width and less than a length corresponding to a pulse repetition interval; and
    crystallizing a semiconductor film by melting a portion of the semiconductor film with the first split beam during a first period and irradiating the second split beam to the melted portion during a second period,
    wherein the second period starts after an end of the first period.

5. A method for manufacturing a semiconductor device according to claim 4, wherein the crystallized semiconductor film is used as a channel of a thin film transistor.

6. A method for manufacturing a semiconductor device according to claim 5, wherein the thin film transistor is applied to an electronic device selected from the group consisting of a display device, a computer, a mobile phone, a digital camera, a digital video camera, a thin film integrated circuit, and a contactless thin film integrated circuit device.

* * * * *